US006765840B2

(12) United States Patent
Sato et al.

(10) Patent No.: US 6,765,840 B2
(45) Date of Patent: Jul. 20, 2004

(54) NONVOLATILE SEMICONDUCTOR MEMORY AND READ METHOD

(75) Inventors: Hiroshi Sato, Ome (JP); Shoji Kubono, Akishima (JP); Toshinori Harada, Ome (JP); Takayuki Kawahara, Higashiyamato (JP); Naoki Miyamoto, Kodaira (JP)

(73) Assignees: Renesas Technology Corp., Tokyo (JP); Hitachi ULSI Systems Co., Ltd., Tokyo (JP); Hitachi Device Engineering Co., Ltd., Chiba (JP)

( * ) Notice: Subject to any disclaimer, the term of this patent is extended or adjusted under 35 U.S.C. 154(b) by 0 days.

(21) Appl. No.: 10/357,477

(22) Filed: Feb. 4, 2003

(65) Prior Publication Data

US 2003/0128604 A1 Jul. 10, 2003

Related U.S. Application Data

(63) Continuation of application No. 10/066,701, filed on Feb. 6, 2002, now Pat. No. 6,556,499, which is a continuation of application No. 09/828,967, filed on Apr. 10, 2001, now Pat. No. 6,385,085, which is a continuation of application No. 09/497,212, filed on Feb. 3, 2000, now Pat. No. 6,222,763, which is a continuation of application No. 08/994,995, filed on Dec. 19, 1997, now Pat. No. 6,026,014.

(30) Foreign Application Priority Data

Dec. 20, 1996 (JP) .............................................. 8-341426

(51) Int. Cl.[7] ................................................ G11C 7/00
(52) U.S. Cl. .................................. 365/226; 365/185.03
(58) Field of Search ............................. 365/226, 185.03

(56) References Cited

U.S. PATENT DOCUMENTS

| 4,188,670 A | * | 2/1980 | Hsia ............................. 365/49 |
|---|---|---|---|
| 4,198,698 A | | 4/1980 | Ong et al. ................... 365/226 |
| 4,415,937 A | | 11/1983 | Nishizawa et al. ......... 358/335 |
| 5,452,406 A | | 9/1995 | Butler et al. ................. 395/126 |
| 5,754,469 A | | 5/1998 | Hung et al. ............ 365/185.03 |
| 5,781,478 A | | 7/1998 | Takeuchi et al. ....... 365/185.03 |
| 6,026,014 A | | 2/2000 | Sato et al. .............. 365/185.03 |
| 6,222,763 B1 | | 4/2001 | Sato et al. .............. 365/185.03 |
| 6,385,085 B2 | | 5/2002 | Sato ....................... 365/185.03 |

FOREIGN PATENT DOCUMENTS

| JP | 2-14581 A | 1/1990 | |
|---|---|---|---|
| JP | 7-14031 | 1/1995 | |
| JP | 11224491 A | 8/1999 | ........... G11C/16/02 |

OTHER PUBLICATIONS

Betty Prince, "Semiconductor Memories" 1983, 2nd Edition, pp. 102–103.

* cited by examiner

*Primary Examiner*—M. Tran
(74) *Attorney, Agent, or Firm*—Antonelli, Terry, Stout & Kraus, LLP

(57) ABSTRACT

In a nonvolatile semiconductor memory in which multiple-value information is stored in one memory cell by setting a plurality of threshold values, data is successively read from word lines while continuously changing the word-line read level from a lowest level to a highest level, and the next bit line is selectively precharged in accordance with the data stored in latch means for storing read data.

6 Claims, 20 Drawing Sheets

DATA LATCH          SENSE LATCH

DATA LATCH          SENSE LATCH

| NODE A | 0 | 1 | 1 |
| NODE B | 0 | 0 | 1 |
| NODE C | 0 | 1 | 0 |

PROGRAM-PROGRAM VERIFY TIMING WAVE

WRITE SEQUENCE WHEN USING AUTO PROGRAM CIRCUIT

FLASH FILE SYSTEM DIAGRAM

EXAMPLE OF VOLTAGE APPLIED WHEN WRITING

EXAMPLE OF VOLTAGE APPLIED WHEN ERASING

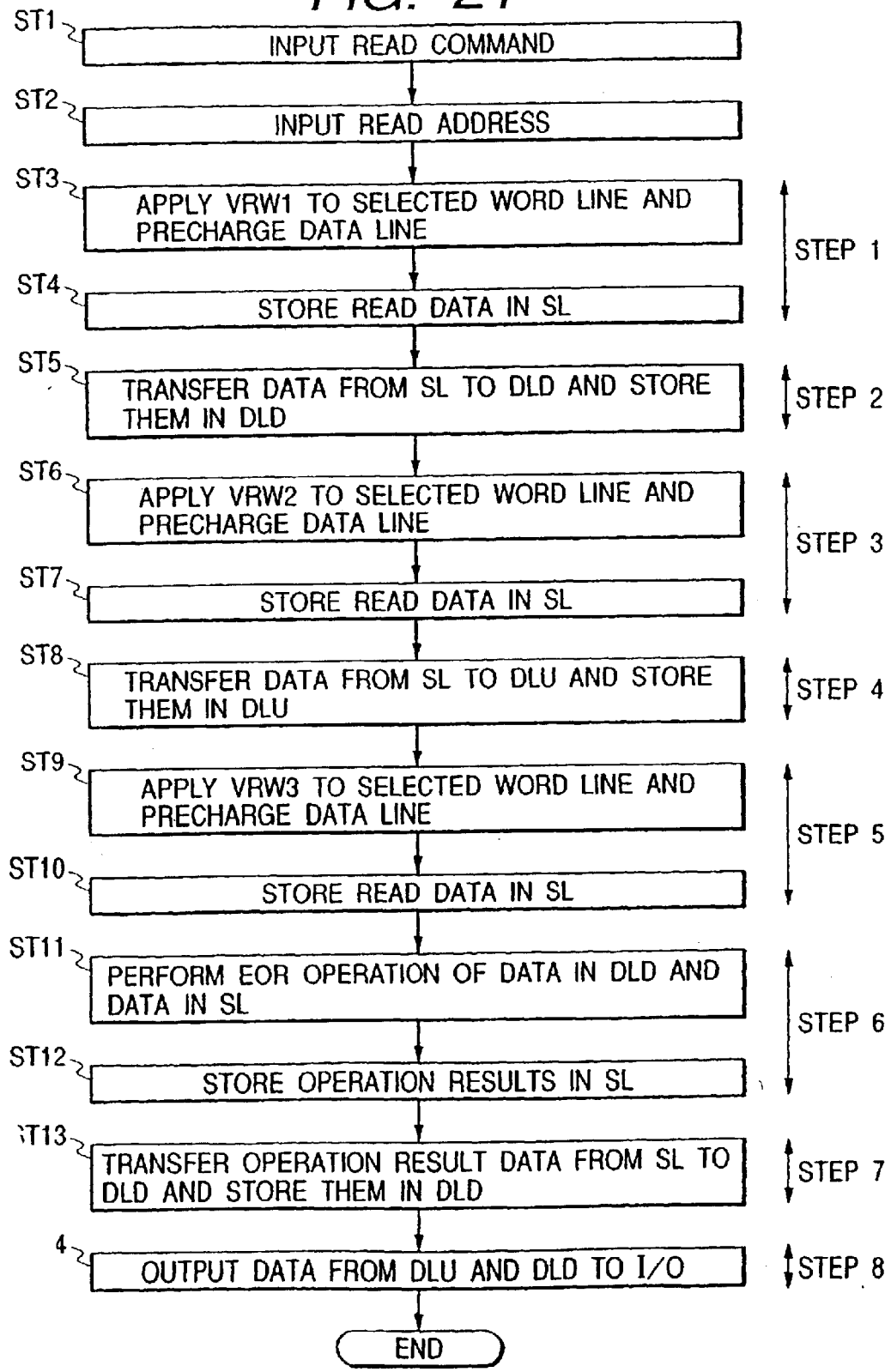

FIG. 22(a)
FIG. 22(b)
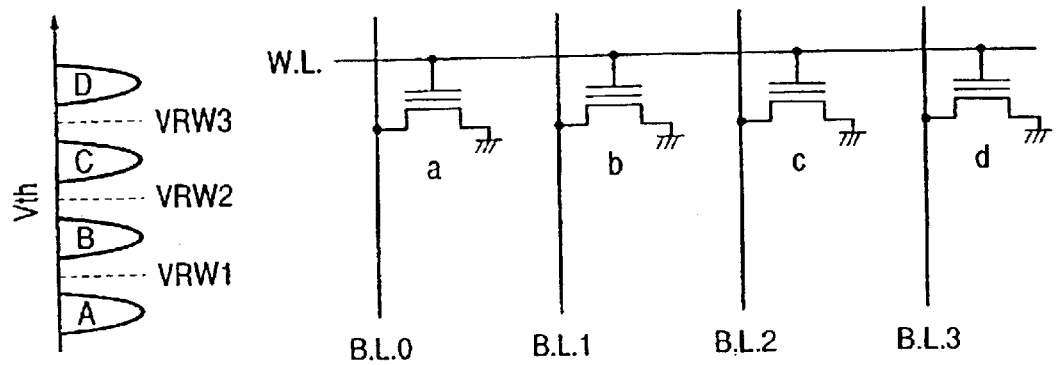
FIG. 22(c)
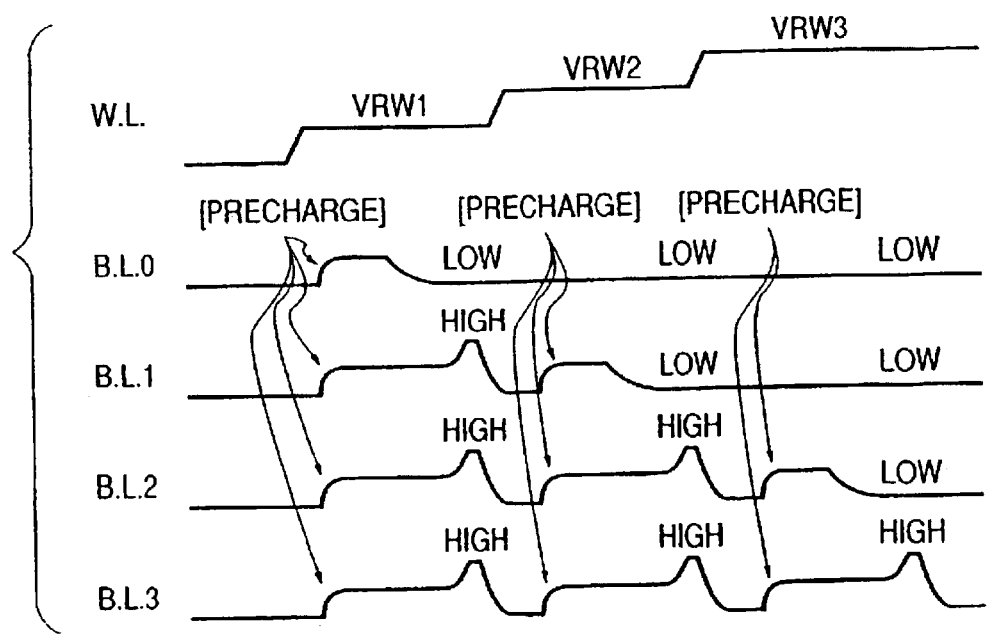

NONVOLATILE SEMICONDUCTOR MEMORY AND READ METHOD

This is a continuation of application Ser. No. 10/066,701, filed Feb. 6, 2002, now U.S. Pat. No. 6,556,499; which is a continuation of Ser. No. 09/828,967, filed Apr. 10, 2001 (now U.S. Pat. No. 6,385,085); which is a continuation of Ser. No. 09/497,212, filed Feb. 3, 2000 (now U.S. Pat. No. 6,222,763); which is a continuation of Ser. No. 08/994,995, filed Dec. 19, 1997 (now U.S. Pat. No. 6,026,014), the entire disclosures of which are hereby incorporated by reference.

BACKGROUND OF THE INVENTION

The present invention relates to a technique, which is particularly applicable to a read method for multiple-value information in a semiconductor memory and, moreover, is effective for a nonvolatile semiconductor memory. More particularly the invention is applicable to a technique which may be effectively used for a nonvolatile memory (hereafter referred to as a flash memory) to electrically simultaneously erase a plurality of stored pieces of information.

A flash memory uses a nonvolatile memory cell having a control gate and a floating gate as a memory cell. It is possible to constitute the memory cell of one transistor. In the case of a write operation of the flash memory, as shown in FIG. 16, a state in which the threshold voltage is low (logic "0") is set up by setting the drain region of a nonvolatile memory cell at approx. 5 V (volt) and a word line connected with a control gate CG at approx. −11 V and, thereby, extracting electric charges from a floating gate FG by means of a tunnel current. In the case of an erase operation, as shown in FIG. 17, a state in which the threshold voltage is high (logic "1") is set up by setting a well region, drain region and source region at approximately 0V and the control gate CG to a high voltage, such as 16V, thereby generating a tunnel current, and injecting negative electric charges into the floating gate CG. During the read operation, it is judged that the data stored in a memory cell through which current flows is "0" and a memory cell through which no current flows is "1" by setting the control gate at an intermediate voltage between a high threshold and a low threshold and detecting whether current flows or not. Thereby, one-bit of data is stored in one memory cell.

A technique has been proposed, which is related to the so-called multiple-value memory, for storing data of two bits or more in one memory cell in order to increase the memory capacity. An invention related to the multiple-value memory is disclosed in Japanese Patent Application No. 14031/1995, etc.

Such a multiple-value memory stores information by controlling the amount of electric charges to be injected into a floating gate, thereby stepwise changing thresholds to 1V, 2V, 3V, . . . , and making information of a plurality of bits correspond to each threshold value. FIG. 18 shows a threshold value distribution state when storing information by dividing one memory cell into four threshold value states (this will be referred to as four-value state in this specification). It is difficult to accurately control the threshold value of a memory cell to a predetermined value for a write operation, and therefore, as shown in FIG. 18, a normal distribution is established around each target threshold voltage. To read data, voltages corresponding to the valleys of the threshold value distributions are read, set as VRW1, VRW2, and VRW3, and applied to a control gate through a word line. In this case, the drain is set at a potential, such as 1V, and the source is set at a potential, such as 0V. The bit-line precharging method can be used for the setting of the drain voltage.

Table 1 shows the results of reading data from memory cells belonging to the threshold value distributions A, B, C, and D by using the above read voltages VRW1, VRW2, and VRW3 (VRW1<VRW2<VRW3). Because the memory cell belonging to the threshold value distribution A has the highest threshold value, no current flows even if any one of VRW1, VRW2, and VRW3 is applied. Therefore, the read result is "1". In the case of the memory cell belonging to the threshold value distribution B, the read result is "1" because no current flows when VRW1 or VRW2 is applied. However, when VRW3 is applied, the read result is "0" because current flows. In the case of the memory cell belonging to the threshold value distribution C, the read result is "1" because no current flows when VRW1 is applied. However, when VRW2 or VRW3 is applied, the read result is "0" because current flows. In the case of the memory cell belonging to the threshold value distribution D, the read result is always "0" in any case because current flows if any one of VRW1, VRW2, and VRW3 is applied. Though a case of a four-value memory has been described above, the same holds theoretically for eight- and sixteen-value memories.

TABLE 1

|  | Memory A | Memory B | Memory C | Memory D |
| --- | --- | --- | --- | --- |
| VRW3 | 1 | 0 | 0 | 0 |
| VRW2 | 1 | 1 | 0 | 0 |
| VRW1 | 1 | 1 | 1 | 0 |

SUMMARY OF THE INVENTION

In the case of a four-value memory, it is possible to store two-bit information because any one of four threshold values can be set in one memory cell. In the case of a conventional two-value memory for storing one-bit of information in one memory, the read operation is performed once because two threshold values are judged to obtain one-bit of information. In the case of a four-value memory, however, it is necessary to perform the read operation three times by changing the potentials of a word line in order to obtain two-bit information. Therefore, simply saying, a problem arises that the read time is three times larger than that of a two-value memory and the power consumption for the read operation also increases three times.

Moreover, in the case of a nonvolatile memory using a MOSFET having a floating gate as a memory cell, a phenomenon (hereafter referred to as read disturb) occurs wherein a small amount of hot electrons generated in the read operation are injected into the floating gate when the read operation is repeated, and, thereby, the threshold value is raised. Therefore, a drawback occurs in that the threshold value fluctuation in a memory cell increases as the read frequency increases, exceeds the read level in the worst case and, resultingly, the stored data may be changed.

Moreover, as described above, it is necessary to apply the earthing potential Vss (0 V) to the source of a memory cell during the read operation. As shown in FIG. 19, a power supply line (ground line) GL for the purpose is extended from the external terminal (ground pin) GND of a chip to each memory cell MC in a memory array M-ARY. The power supply line is generally constituted of a metal wiring layer made of, for example, aluminum. However, at a portion where the aluminum wiring is used for another signal line, such as a bit line, the earthing potential may be applied to each memory cell MC through a diffusion layer having a large resistance value. In this case, as shown in FIG. 19, the ground line length differs between the memory cell closest to the ground GND and the memory cell farthest from the ground GND. For example, the wiring of the diffusion layer has a resistance value of hundreds of mΩ per μm and even a metal wiring has a resistance value of approx. 100 Ω. Therefore, a portion between the ground pin and the memory cell farthest from the ground pin GND has hundreds to thousands of Ω. Therefore, when a current flows from a memory cell during a read operation, the source potential rises and, thereby, the source potential greatly differs between the memory cell closest to the ground pin and the memory cell farthest from the ground pin. If the read current is 3 mA and the ground resistance differs by 100 Ω, a difference of 0.3 V occurs in the source potential.

In the case of a memory cell, the drain current logarithmically changes nearby the threshold value as known from the characteristics of a MOSFET. Therefore, when the source potential rises and the voltage between the gate and source lowers, the current decreases by one-tenth to one-hundredth. In this case, if the characteristics of memory cells belonging to the distributions B and D in FIG. 18 have the characteristics shown by b and d in FIG. 20, a sufficient amount of current can be ensured even if the source potential slightly rises when applying a voltage of 5 V to each gate because the memory cell D is in a completely saturated region. However, because the memory cell B is only slightly saturated, it is found that the current is greatly decreased due to a slight rise of the source potential and, thereby, no data can be read or erroneous data may be read.

It is an object of the present invention to provide a multiple-value storage nonvolatile semiconductor memory having a short read time and a small power consumption.

It is another object of the present invention to provide a multiple-value storage nonvolatile semiconductor memory which is capable of minimizing the necessary read frequency and preventing stored data from easily changing.

It is still another object of the present invention to provide a multiple-value storage nonvolatile semiconductor memory which is capable of preventing the source potential from rising during a read operation and preventing a data read operation from failing or data from being erroneously read.

The above and other objects and novel features of the present invention will become more apparent from the description provided in this specification and the accompanying drawings.

The outline of a representative one of the embodiments disclosed in this application will be briefly described below.

That is, in the case of a nonvolatile semiconductor memory where multiple-value information is stored in one memory cell by setting a plurality of threshold values, data is successively read while changing the word-line read level from a lower value to a higher one and selectively precharging a bit line for the next read operation in accordance with the data stored in latching means for holding read data.

As understood by referring to Table 1, by changing the word-line read level from a lower value to a higher one successively, "0" is read from a memory cell from which "0" has already been read even after reading data from the memory cell by raising the read level. Therefore, the result is the same as the case when the read operation is not performed. That is, it is possible to omit the precharging of the bit line. Moreover, because the current consumption can be reduced by the omission of the precharging, it is possible to reduce the current flowing from a memory array to a ground line during the read operation. Thereby, it is possible to decrease the rise of the source potential of a memory cell. Therefore, it is possible to prevent a data read operation from failing or data from being erroneously read. Moreover, because the read frequency can be decreased by the omission of precharging, it is possible to suppress the threshold value fluctuation due to a read disturb condition, that is, to suppress a change in the stored data. Furthermore, by the above read method, because all of the read data will become "0" before the memory cells connected to a selected word line are read when they have a low threshold value, it is possible to interrupt the read operation by using all-"0" judging means and, moreover, to reduce the current consumption and the data read time.

Furthermore, it is preferable to determine the correspondence between the threshold values of memory cells and the data stored in the memory cells so that the codes of the stored data are so arranged as to be different only in one bit between adjacent threshold values. Specifically, in the case of a four-value memory, the threshold value distributions A, B, C, and D of FIG. 18 are made to correspond to two-bit data values "11", "10", "00", and "01". Thus, there is an advantage that, even if a read disturb condition occurs, the load of an error correction circuit for correcting the read disturb condition can be lightened and the circuit scale also can be decreased. For example, if the threshold value of a memory cell in the threshold value distribution B of FIG. 18 is shifted to the threshold value distribution C due to a disturb condition, only one bit has an error because the original stored data "10" is erroneously read as "00" in the case of the above correspondence. However, when the threshold value distributions A, B, C, and D of FIG. 18 are made to correspond to two-bit data values "11", "10", "01", and "00", if the threshold value of the memory cell is shifted from B to C, "10" is erroneously read as "01" and thereby, a two-bit error occurs. To correct the two-bit error, however, the load of the error correction circuit and the circuit scale are greatly increased.

BRIEF DESCRIPTION OF THE DRAWINGS

FIG. 21 is a flow chart showing the read procedure of the multiple-value flash memory of the present invention; and FIGS. 22(A) to 22(C) are diagrams showing the change of data-line potentials of the multiple-value flash memory of the present invention at the time of write operation.

DESCRIPTION OF THE PREFERRED EMBODIMENT

An embodiment in which the present invention is applied to a flash memory capable of storing four values in one memory cell will be described below with reference to the accompanying drawings.

First, the data read procedure for the flash memory of this embodiment will be briefly described below with reference to FIG. 1. In the case of this embodiment, a memory array is constituted of two mats. A sense & latch circuit (hereafter referred to as a sense latch and denoted by SL in FIG. 1) connected to a bit line BL in each mat to amplify and latch a read signal is provided between two mats, and latch circuits for temporarily holding read data are provided outside the mats, that is, on the opposite sides of each bit line BL. A latch circuit is hereafter referred to as the data latch and is denoted by DL in FIG. 1. Moreover, the upper mat of the two mats is denoted by symbol U and the lower mat is denoted by symbol D to distinguish the upper mat from the lower mat. Symbol WL denotes a word line and MC denotes a memory cell.

In the case of this embodiment, before starting a read operation, every bit line BL of the mat on the selected side (here, assume that a memory cell in the upper mat is selected) is precharged to a potential such as of 1.0 V. The above precharging is performed by setting data, for which the input/output node of the selected mat side becomes level "1", in the sense latch SL. The setting of data in the sense latch SL is performed by earthing the node of the non-selected side to the ground through a MOSFET and making the input/output node of the sense-latch selected side high-level. The bit line of the non-selected side is half-precharged to a potential such as of 0.5 V, so that data is detected by comparing the bit-line potential of the selected side with that of the non-selected side.

Then, one of the word lines of the selected mat side is first set at the lowest read level VRW1 (=1.5 V). Then, data of one row is read from the memory cell connected to the word line. Thereby, the data values read to a corresponding sense latch SL from memory cells having the highest threshold value (the stored data is "11"), the second highest threshold value (the stored data is "10"), the third highest threshold value (the stored data is "00") become "1" and only the data value read to a corresponding sense latch SL from a memory cell having the lowest threshold voltage (the stored data is "01") becomes "0" (step S1).

Figure 2A:
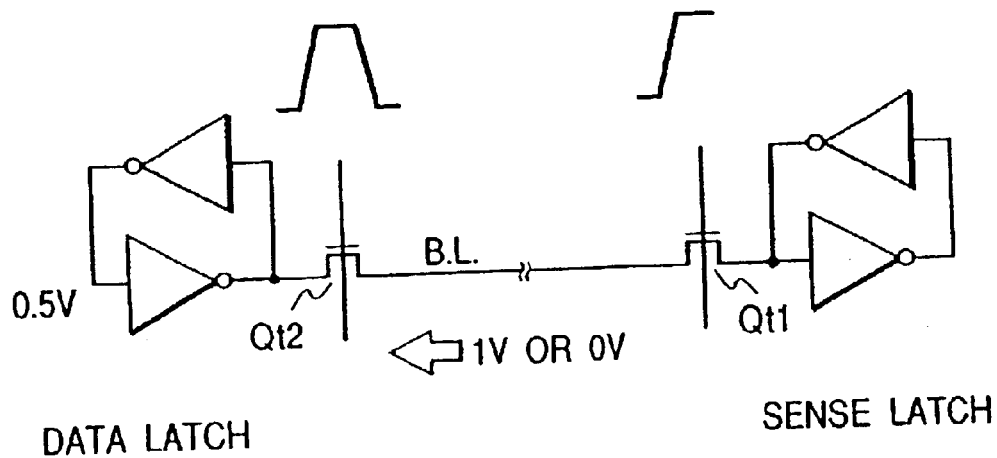
FIGS. 2(A) and 2(B) are schematic circuit diagrams showing a method for transferring data stored by a sense latch to a data latch through a bit line.

In step 2, the data read to and stored in the sense latch SL is transferred to a data latch DLD through a bit line BL of the non-selected side mat. Though the above data transfer will be described later, it is conceptually understood that the data transfer is performed by turning on transfer MOSFETs Qt1 and Qt2 provided between the bit line BL and the sense latch SL and between the bit line BL and the data latch DL (DLU and DLD), respectively, as shown in FIG. 2. Moreover, in this case, data opposite to the above stored data appears on the input/output node of the non-selected mat side of the sense latch SL. Therefore, the data transferred to and stored in the data latch DL becomes the data obtained by inverting the data stored in the sense latch SL. When the data transfer is completed, the potential of every bit line is lowered to the earthing potential (0 V) by turning on every discharge MOSFET (described later) provided on each bit line BL (this is hereafter referred to as bit-line reset).

In step 3, the bit lines BL in the selected-side mat are first precharged by using the data stored in the sense latch SL. Thereby, bit lines connected to the sense latch holding data "0" are not precharged and thereby, the power consumption can be reduced. After the precharging is completed, the same word line set to the selection level in step 1 is set at the second read level VRW2 such as of 2.5 V to read data of one row from the memory cell connected to the word line. Thereby, the data values read to the corresponding sense latch SL from the memory cells having the highest threshold value (the stored data is "11") and the second highest threshold value (the stored data is "10") become "1" and the data values read to the corresponding sense latch SL from the memory cells having the third highest threshold value (the stored data is "00") and the lowest threshold value (the stored data is "01") become "0".

In step 4, the data read to and stored in the sense latch SL is transferred to the data latch DLU through the bit line BL of the selected-side mat. This data transfer is also performed by turning on MOSFETs Qt1 and Qt2 provided between the bit line BL and the sense latch SL and between the bit line BL and the data latch DL, respectively. In this case, because the same data as the stored data appears on the input/output node of the selected-side mat of the sense latch SL, the data to be transferred to and stored in the data latch DLU becomes the same data as the data stored in the sense latch SL differently from the case of step 2. When the data transfer is completed, bit lines are reset by turning on every discharge MOSFET (to be described later) provided on each bit line.

In step 5, the bit lines BL in the selected-side mat are first precharged by using the data stored in the sense latch SL.

After the precharging is completed, the same word line set at the selection level in step 1 is set at the third read level VRW3 such as of 3.5 V to read the data of one row is read from the memory cell connected to the word line. Thereby, only the data value read to the corresponding sense latch SL from the memory cell having the highest threshold value (the stored data is "11") becomes "1" and the data values read to the corresponding sense latch SL from the memory cells having the second highest threshold value (the stored data is "11"), the third highest threshold value (the stored data is "10"), and the lowest threshold value (the stored data is "01") become "0".

Figure 2B:
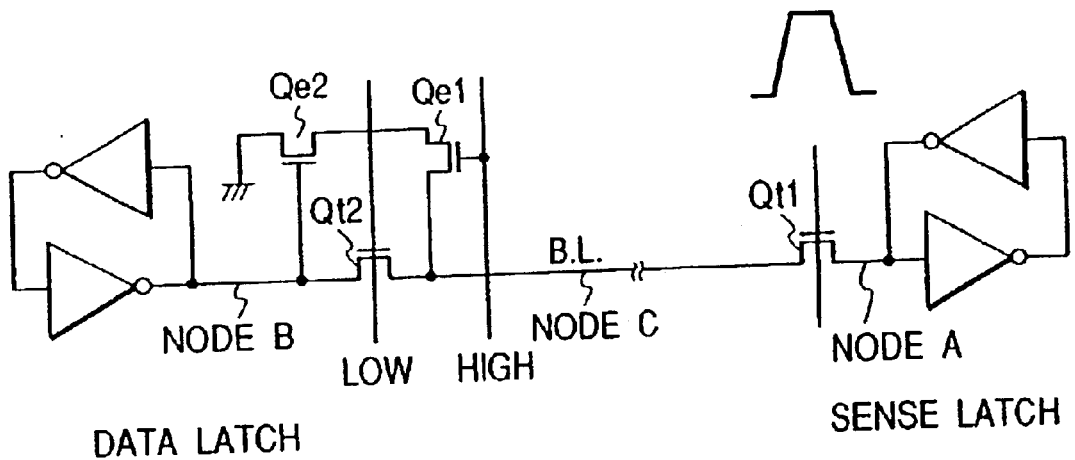

In step 6, the exclusive OR logical operation of the inverted data read to and stored in the sense latch SL and the data (inverted data of selected memory cell) stored in the data latch DLD of the non-selected side is performed through the wired logical operation using the bit line BL. That is, in the case of this embodiment, as shown in FIG. 2(B), the stored data is output to the bit line BL by temporarily turning on the MOSFET Qt2 for transfer of the sense latch SL side while turning on a MOSFET Qe1 and turning off a MOSFET Qe2 which are connected in series and provided between the bit line BL and the earthing conductor so as to bypass the transfer MOSFET provided between the bit line BL and the data latch DLD. Moreover, Qe2 is turned on/off in accordance with the data stored in the data latch DLD. Then, in this case, because Qe2 is turned off when the data store in the data latch DLD is "0", the bit line keeps the data, as it is output from the sense latch SL. However, when the data stored in the data latch DLD is "1", Qe2 is turned on and thereby, the level of the bit line BL is lowered to the earthing potential.

By controlling the operations of the MOSFETs Qt1, Qt2, Qe1, and Qe2 as described above, the logical operation results shown by the truth table of FIG. 2(B) remain on the bit line BL. However, the logical operation results when the data stored in the sense latch SL is "0" and the data stored in the data latch DLD is "1" are not shown in the truth table. This is because a memory cell for which the read data first becomes "0" always has read data of "0" thereafter (since the read operation is started with the lowest read word line level) and therefore, the above case does not occur in which the data stored in the sense latch SL is "0" and the data stored in the data latch DLD is "1" at the non-selected side.

In step 7, by resetting the data latch DLD and then, turning on the transfer MOSFET Qt2, the operation results on the bit line are transferred to and stored in the data latch DLD. Then, the data (transferred to) stored in the data latch DLD is inverted and supplied to an output circuit while the data stored in the data latch DLU at the selected side is supplied to the output circuit as it is and output to an external unit at a predetermined timing. As a result, stored data corresponding to the threshold value of a memory cell which is subjected to the read operation is output to an external unit.

Figure 3:
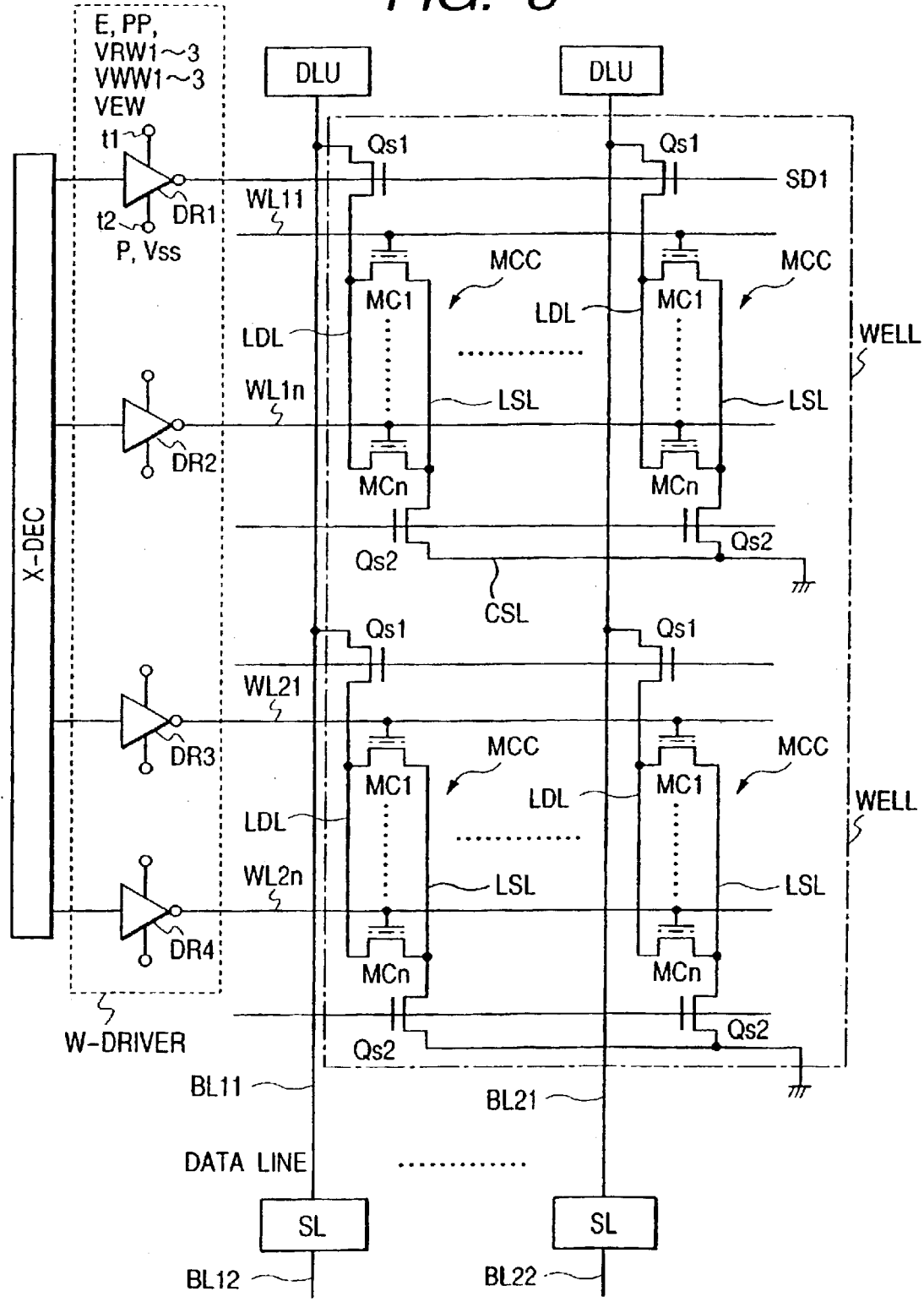
FIG. 3 is a circuit diagram showing a specific example of a memory array.

FIG. 3 shows a specific example of a memory array 10 and its peripheral circuits. The memory array 10 of this embodiment is constituted of two mats, and a specific example of one (upper side) of the two memory mats is shown in FIG. 3. In each memory mat, as shown in FIG. 3, a plurality of memory arrays MCC comprising n memory cells (MOSFETs each having a floating gate) MCl to MCn which are connected in parallel and arranged in the column direction and whose source and drain are connected in common are arranged in the row direction (direction of word-line WL) and in the column direction (direction of bit line BL). In each memory array MCC, the drains of n memory cells MC1 to MCn are connected to a common local drain line LDL and the sources are connected to a common local source line LSL. The local drain line LDL is constituted so that it can be connected to the bit line BL through a selection switch MOSFET Qs1 and the local source line LSL is constituted so that it can be connected to an earthing point or a negative voltage through a selection switch MOSFET Qs2.

A word drive circuit W-DRIVER has driver circuits DR1 to DR4. The driver circuits DR1 to DR4 each have power supply terminals t1 and t2 and are connected to their corresponding word lines WL1*n*, WL1*n*, WL21, and WL2*n*. Erase voltage E, write protect voltage PP, read voltages VRW1 to VRW3, write verify voltages VWW1 to VWW3, erase verify voltage WEW, write voltage P, and earthing potential Vss are generated by the power supply switching circuit shown in FIG. 14 and supplied to an address decoder X-DEC. The address decoder X-DEC selects the above supplied voltages and supplies them to the power supply terminals t1 and t2 of the driver circuits DR1 to DR4. The write protect voltage PP, read voltages VRW1 to VRW3, write verify voltages VWW1 to VWW3, and erase verify voltage WEW are selectively supplied to the power supply terminal t1. Moreover, the write voltage P and earthing potential Vss are selectively supplied to the power supply terminal t2.

The memory array MCC and selection switch MOSFETs Qs1 and Qs2 are formed in the same well region WELL on a semiconductor substrate. Data can be simultaneously erased for every word line by applying an erase voltage E (=16V) to the word lines. When data is erased, the switch MOSFETs Qs1 and Qs2 of a block, including the erase word lines, are turned on, so that a voltage such as 0V is applied to a selected block and the source and drain of a memory cell.

When data is written, a negative voltage, such as the write voltage P (=−11V), is applied to a word line to which a memory cell to be selected is connected, the bit lines BL corresponding to the memory cell to be selected is set at a potential such as 5V, the switch MOSFET Qs1 on the local drain line LDL to which a selected memory cell is connected is turned on, and a voltage of 5V is applied to the drain. However, the selection switch MOSFET Qs2 on the local source line LSL is kept off. Moreover, when data is read, voltages, such as the read voltages VRW1 (=1.5 V), VRW2 (=2.5 V) and VRW3 (=3.5 V), are applied to a word line to which a memory cell to be selected is connected, the bit line BL corresponding to the memory cell to be selected is precharged to a potential such as 1 V, and the selection switch MOSFET Qs1 on the local drain line LDL to which a selected memory cell is connected is turned on. Moreover, in this case, the selection switch MOSFET Qs2 on the local source line LSL is on and the earthing potential is applied.

A sense amplifier for detecting the level of a bit line at the time of a read operation and for supplying a potential corresponding to write data at the time of a write operation and a sense latch circuit SL comprising a transfer MOSFET (Qt1) and a precharge MOSFET are connected to one end (central side of the memory array) of the bit line BL. A data latch circuit DLV, comprising a latch circuit capable of holding write data and read data, a transfer MOSFET (Qt2) and additional circuits (Qe1 and Qe2) used for an arithmetic operation, is connected to the other end of the bit line BL. The memory array of this embodiment is constituted of two mats, and hence memory mats which are the same as the above are also arranged on the opposite side of the sense latch circuit SL, that is, the lower side of FIG. 3. Therefore, each bit line BL in the memory array is connected to the other input/output terminal of the corresponding sense latch circuit SL.

Moreover, in the above embodiment, a case has been described in which corresponding control MOSFETs (such as the transfer MOSFETs Qt1 and Qt2) on all bit lines are constituted so as to be controlled for each memory mat in accordance with a common control signal. Moreover, it is possible to lighten the load of the circuit for generating a control signal by dividing bit lines into two groups, i.e. a group of bit lines of odd-numbered columns and a group of bit lines of even-numbered columns, and controlling mutually corresponding control MOSFETs of the groups in accordance with a common control signal.

Figure 4:
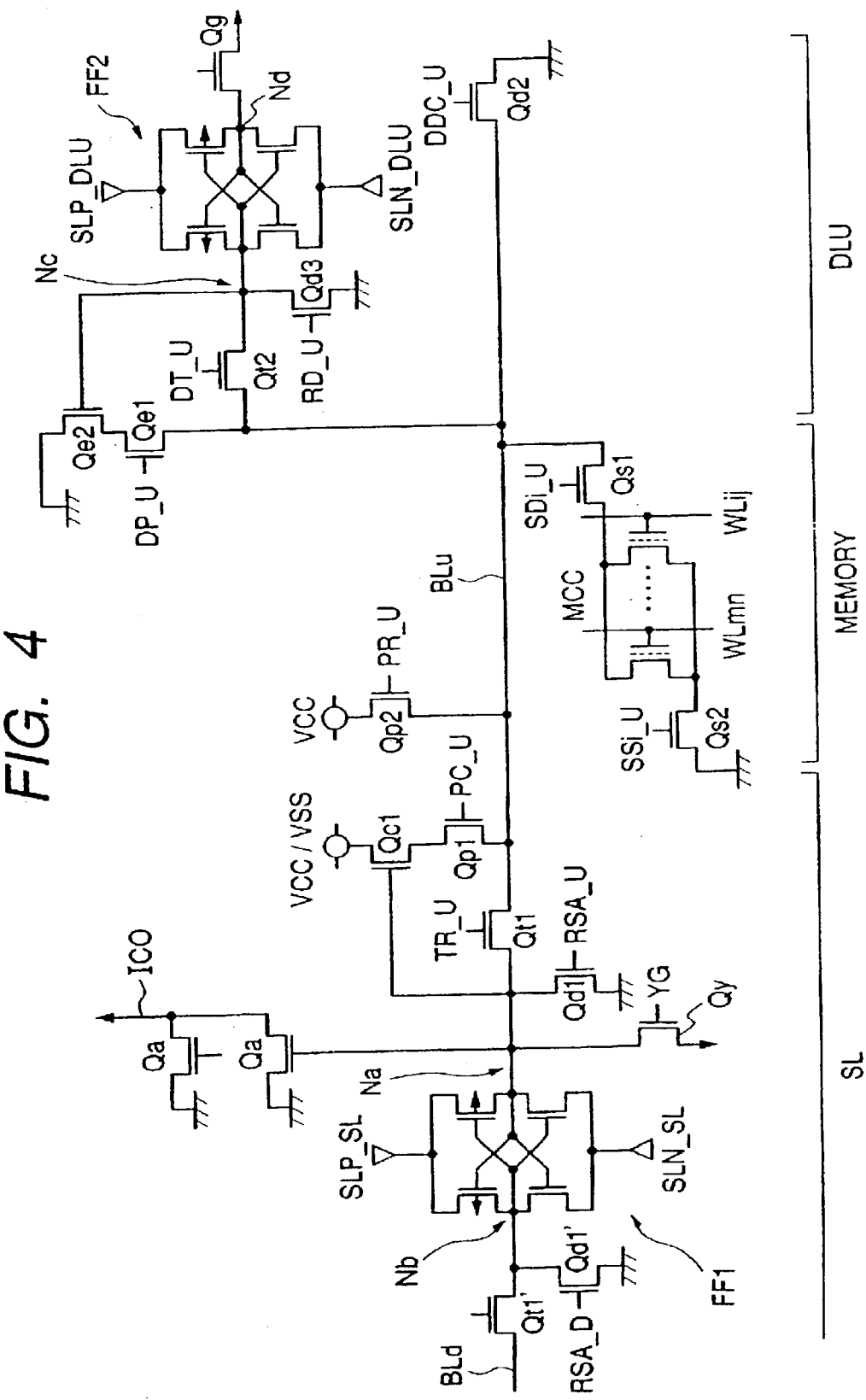
FIG. 4 is a circuit diagram showing a specific example of a sense latch circuit and a specific example of a data latch circuit.

FIG. 4 shows specific circuit examples of the sense latch circuit SL and the data latch circuit DLU. Because the circuits are arranged symmetrically with respect to the sense latch circuit, only one bit line in one memory mat is illustrated and only one memory array MCC among the memory arrays connected to bit lines is shown for the convenience of illustration. Actually, however, a plurality of memory arrays MCC are connected.

As shown in FIG. 4, the sense latch circuit SL is provided with a flip-flop circuit FF1 in which input/output terminals of two CMOS inverters comprising a P-channel MOSFET and an N-channel MOSFET are cross-connected to each other. Moreover, a bit line BLu in one memory mat is connected to one input/output terminal Na of the sense latch circuit SL through a data transfer MOSFET Qt1. Furthermore, a bit line BLd in the other memory mat is connected to the other input/output terminal Nb of the sense latch circuit SL through a data transfer MOSFET Qt1'.

Furthermore, discharge MOSFETs Qd1 and Qd1' are connected to the input/output terminals Na and Nb of the sense latch circuit SL and a discharge MOSFET Qd2 is also connected to the other end of the bit line BLu. Furthermore, precharge MOSFETs Qp1 and Qp2 are connected to each bit line BLu. The MOSFET Qp1 is connected to a terminal to which a power supply voltage Vcc is supplied through a MOSFET Qc1. The gate of the MOSFET Qc1 is connected to the input/output terminal Na of the flip-flop FF1 and is turned on/off in accordance with the data stored in the flip-flop FF1. When a PCU is set at a potential such as 1V+Vth (threshold voltage), a corresponding bit line is precharged to 1 V when the data stored in the FF1 is "1". Moreover, in this case, a precharge MOSFET Qp2' (corresponding to Qp2) on the non-selected side is precharged to 0.5 V because a gate control signal PRD (corresponding to PRU) is set at a potential such as 0.5V+Vth.

The input/output terminals Na and Nb of the sense latch circuit SL can be connected to a common input/output line CI/O whose other end is connected to a data switching circuit through a column switch MOSFET (Y gate) Qy. Moreover, the gate of an all-"0" judging MOSFET Qa is connected to the input/output terminals Na and Nb of the sense latch circuit SL. The source of the all-"0" judging MOSFET Qa is connected to an earthing point and the drain is connected to a common output line ICO to be previously precharged. When even one data value of the data values stored in the sense latch SL is "1", the corresponding MOSFET Qa is turned on and the potential of the common output line ICO is extracted. Therefore, when the potential of the common output line ICO is at a high-level, it is possible to judge that all the data values stored in the sense latch SL are "0".

Moreover, the data latch circuit DLU is provided with a flip-flop circuit FF2 in which input/output terminals of two CMOS inverters comprising a P-channel MOSFET and an N-channel MOSFET are cross-connected to each other, similar to the sense latch circuit SL. Moreover, a bit line BLu in a memory mat is connected to one input/output terminal Nc of the data latch circuit DLU through a data transfer MOSFET Qt2. Furthermore, a discharge MOSFET Qd3 is connected to the input/output terminal NC of the data latch circuit DLU, and MOSFETs Qe1 and Qe2 turned on/off in accordance with a precharge signal DP_U and the potential of the input/output terminal Nc are connected in series between the bit line BLu and the earthing point.

Furthermore, the input/output terminal Nc of the data latch circuit DLU can be connected to a data switching circuit through a MOSFET Qg. Furthermore, though not shown in FIG. 4, a data latch circuit DLD comprising a flip-flop circuit and the like is also provided to the other end of a bit line BLd connected to the input/output terminal Nb of the sense latch circuit SL.

FIG. 21 shows a flow chart of a data read operation. When a read command is input in step 1 (ST1), the flash memory is brought to a read mode. In step 2 (ST2), a read address is input. The read address is decoded by the address decoder and a word line is selected. In step 3 (ST3), a read voltage VRW1 is applied to the selected word line, the data lines in one memory mat (selected-side memory mat) having the selected word line are precharged by the precharge MOSFET Qp1, and all the data lines are precharged to 1 V. All the data lines in the other memory mat (non-selected-side memory mat) are precharged to 0.5 V by the precharge MOSFET Qp2. In step 4 (ST4), the data read from the selected word line is stored in the sense latch circuit SL. In step 5 (ST5), the data stored in the sense latch circuit SL is transferred to and stored in the data latch circuit DLD. In step 6 (ST6), a read voltage VRW2 is applied to the selected word line and all the data lines in the selected-side memory mat are precharged by the precharge MOSFET Qp1. In step 4, however, the data line connected to the sense latch circuit SL storing "0" data (threshold value lower than the read voltage VRW1) is not precharged to 1 V because the MOSFET Qc1 is not turned on. That is, the only data line precharged to 1 V in step 6 is a data line connected to the sense latch circuit SL storing "1" data (threshold value higher than the read voltage VRW1) at the time of the data read operati in step 3. All the data lines in the non-selected-side memory mat are precharged to 0.5 V by the precharge MOSFET Qp2. The data read from the word line selected in step 7 (ST7) is stored in the sense latch circuit SL. The data stored in the sense latch circuit SL in step 8 (ST8) is transferred to and stored in the data latch circuit DLU. In step 9 (ST9), a read voltage VRW3 is applied to the selected word line and all the data lines in the selected-side memory mat are precharged by the precharge MOSFET Qp1. In steps 4 and 7, however, the data lines connected to the sense latch circuit SL storing "0" data (threshold value lower than the read voltage VRW2) are not precharged to 1 V because the MOSFET Qc1 is not turned on. That is, the only data line precharged to 1 V in step 9 is the data line connected to the sense latch circuit SL storing "1" data (threshold value higher than the read voltage VRW2). All the data lines in the non-selected-side memory mat are precharged to 0.5 V by the precharge MOSFET Qp2. In step 10 (ST10), the data read from the selected word line is stored in the sense latch circuit SL. In step 11 (ST11), the exclusive OR logical operation of the data stored in the data latch circuit DLD in step 5 and the data stored in the sense latch circuit SL in step 10 is performed. In step 12 (ST12), the operation result in step 10 is stored in the sense latch circuit. In step 13 (ST13), the operation result stored in the sense latch circuit is transferred to and stored in the data register DLD. In step 14 (ST14), the data stored in the data registers DLU and DLD are output from the external terminal I/O shown in FIG. 14.

When data lines are divided into a group of data lines of the odd-numbered columns and a group of data lines of the even-numbered columns to read the data, the precharge operation of the data lines of odd-numbered columns is performed, and thereafter data is read and stored in the sense latch circuit connected to the data lines of the odd-numbered columns. Then, the precharge operation of the data lines of the even-numbered columns is performed, and thereafter data is read and stored in the sense latch circuit connected to the data lines of the even-numbered columns.

Figure 1:
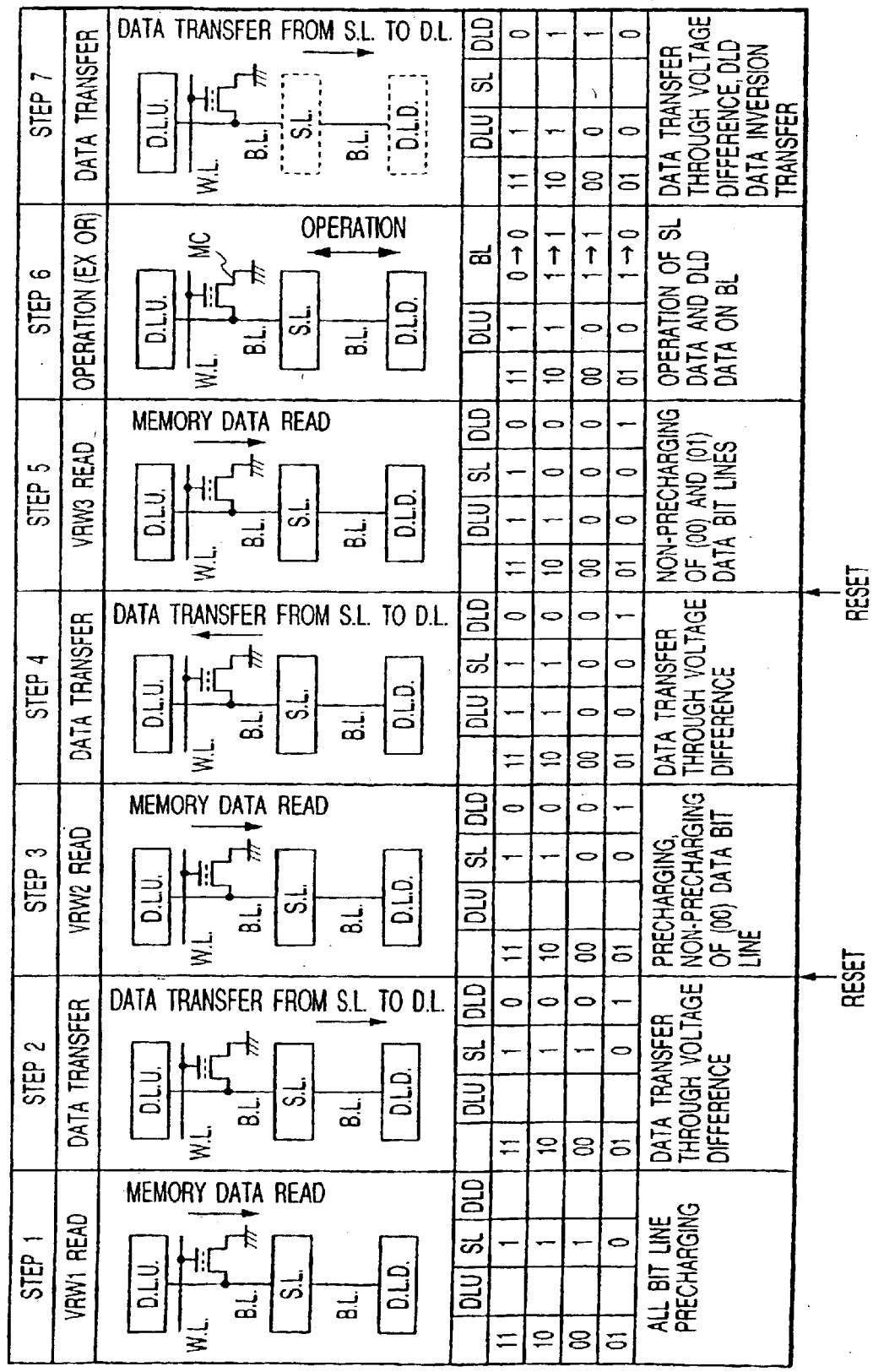
FIG. 1 is a chart showing the outline of a data read method of a multiple-value flash memory of the present invention.

In FIG. 21, step 3 (ST3) and step 4 (ST4) correspond to step 1 (Step 1) of FIG. 1, step 5 (ST5) corresponds to step 2 (Step 2) of FIG. 1, step 6 (ST6) and step 7 (ST7) correspond to step 3 (Step 3) of FIG. 1, step 8 (ST8) corresponds to step 4 (Step 4) of FIG. 1, step 9 (ST9) and step 10 (ST10) correspond to step 5 (Step 5) of FIG. 1, step 11 (ST11) and step 12 (ST12) correspond to step 6 (Step 6) of FIG. 1, step 13 (ST13) corresponds to step 7 (Step 7) of FIG. 1, and step 14 (ST14) corresponds to step 8 (Step 8) of FIG. 1.

FIG. 22(a) is a diagram showing the change of potentials of data lines in the selected-side memory mat during the data read operation. In FIG. 22(b), for easy understanding, to a word line WL, only a memory cell a belonging to a threshold value distribution A, a memory cell b belonging to a threshold value distribution B, a memory cell c belonging to a threshold value distribution C, and a memory cell d belonging to a threshold value distribution D. The memory cells a, b, c, and d are connected to their corresponding data lines BL0 to BL3. When the read voltage VRW1 is applied to the word line WL, the data lines BL0 to BL3 are all precharged to 1 V. Because the memory cell a is turned on, only the data line BL0 becomes low-level. Then, when the read voltage VRW2 is applied to the word line WL, the data lines BL1 to BL3 are precharged to 1 V, though the data line BL0 remains at the low level. Because the memory cell b is turned on, the data line BL1 becomes low-level. Moreover, when the read voltage VRW3 is applied to the word line WL, the data lines BL2 and BL3 are precharged to 1 V, though the data lines BL0 and BL1 remain at the low level. Because the memory cell c is turned on, the data line BL2 becomes low-level. Thus, a data line from which "0" data is once read is not precharged even if the precharge operation is executed.

Figure 5:
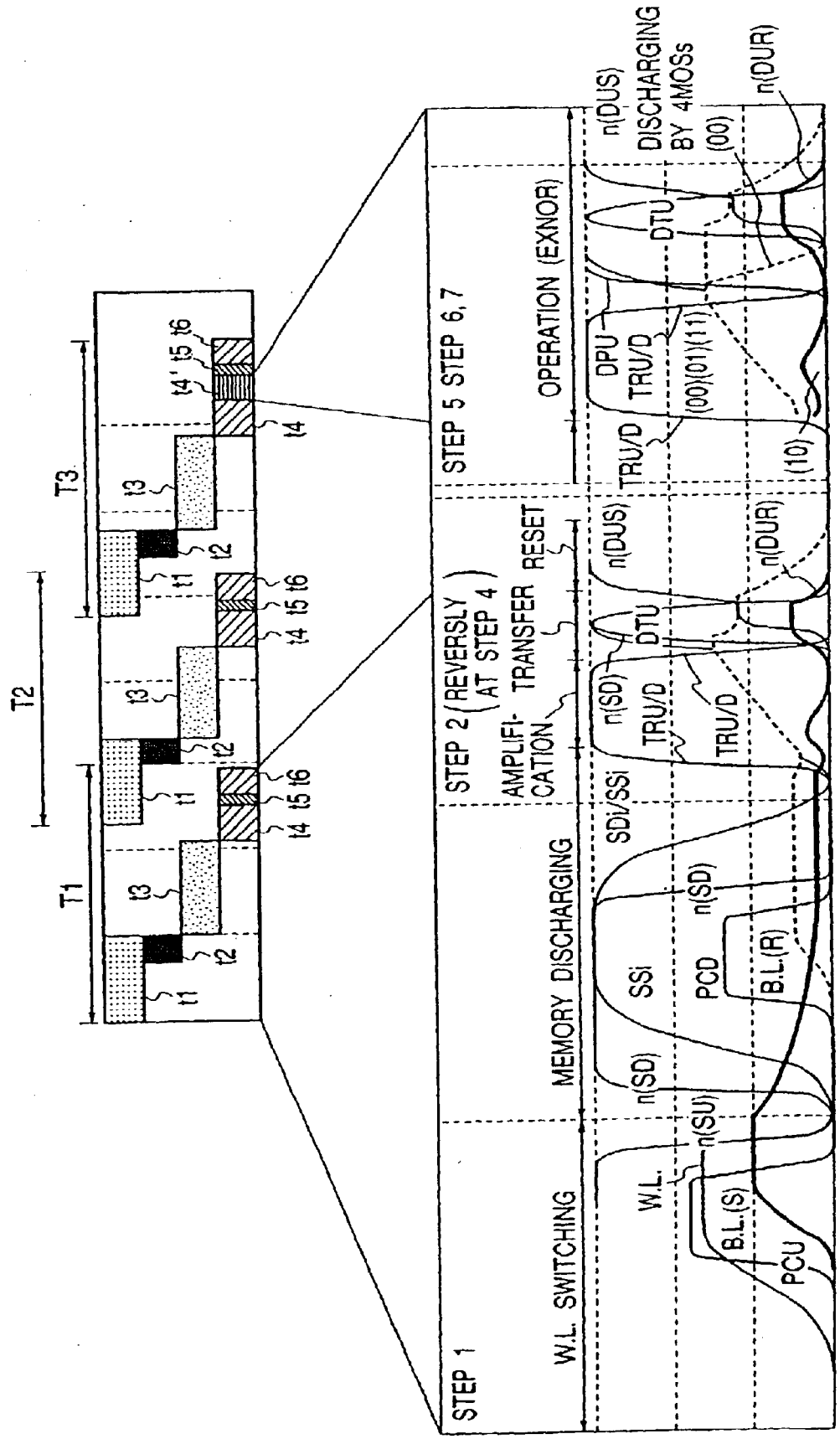
FIG. 5 is a timing chart showing the timings of a data read operation of the multiple-value flash memory according to an embodiment of the present invention.

FIG. 5 shows the timings when data is read. In FIG. 5, symbol T1 denotes the first-time data reading period, T2 denotes the second-time data reading period, and T3 denotes the third-time data reading period. In each reading period, the read operation is performed in accordance with almost the same procedure. Each reading period is further divided into a word-line switching period t1, a bit-line precharging period t2, a discharging period t3 by a memory, an amplifying period t4 by a sense latch circuit SL, a period t5 for transferring data from a sense latch to a data latch, and a bit-line resetting period t6. The data transfer direction in the second-time data reading period is opposite to the data transfer direction in the first-time data reading period. Moreover, in the third-time reading period T3, an operating period t4' is inserted between the amplifying period t4 and the data transfer period and data transfer is slightly different from the cases of the first- and second-time reading periods in that the third read data value in the sense latch SL and the first and second read data values stored in the data latches DLU and DLD are transferred to a buffer circuit.

Moreover, in FIG. 5, symbol W.L. denotes the potential of a selected word line, B.L. denotes the potential of a bit line, PCU denotes a gate control signal of the precharge MOSFET Qp1, PCD denotes a gate control signal of the precharge MOSFET Qp1 of the opposite-side mat, n(SU) and n(SD) denote potentials of input/output nodes Na and Nb of the sense latch SL, TRU/D denotes a gate control signal of the transfer MOSFET Qt2, TRU/D denotes a gate control signal of the transfer MOSFET Qt2, n(DUS) denotes the potential of an input node Nc of data latch, SSi and SDi denote control signals of the selection switches Qs1 and Qs2, and DPU denotes a gate control signal of the MOSFET Qe1 on the data latch DLU side.

When the read voltage VRW1 (1.5 V) is applied to the word line WL and the voltage of 1V+Vth is applied to the gate of the precharge MOSFET QP1 in the selected-side memory mat during the WL switching operation, a data line BL(S) is precharged to 1 V. When a high-level signal RSAU is applied to the gate of the MOSFET Qd1 assuming that "1" data is stored in the sense latch circuit, the potential of the input/output node Na of the sense latch circuit is set at the low level. In the memory discharge operation, when the potential of the input/output node Nb of the sense latch circuit is set at the low level, the potential of the input/output node Nb of the sense latch circuit becomes high-level. When the voltage of 0.5V+Vth is applied to the gate of the precharge MOSFET QP2 in the non-selected-side memory mat, a data line BL(R) is precharged to 0.5 V. It is also possible to precharge a data line in the non-selected-side memory mat during the WL switching operation. Because the threshold value of a memory cell connected to a selected word line WL is lower than the read voltage VRW1, the potential of the data line BL (S) is gradually lowered from the precharge level of 1 V when high-level signals SDi and SSi are applied to the gates of the switch MOSFETs Qs1 and Qs2. In the amplifying operation, high-level signals TRU and TRD are applied to the gates of transfer MOSFETs Qt1 and Qt1' in order to turn on the transfer MOSFETs Qt1 and Qt1'. In this case, the sense latch circuit and the data line are connected to each other and the sense latch circuit amplifies the data on the data line. When a high-level signal DTU is applied to the gate of the transfer MOSFET Qt2 provided between the data register DLU and the data line BL (S) in the transfer operation, the data amplified by the sense latch circuit is transferred to and stored in the data register DLU. When high-level signals RSAU and RSAD are applied to the gates of the discharge MOSFETs Qd1 and Qd1' in the reset operation, the data lines BL(S) and BL(R) are reset to 0 V. During the arithmetic operation, the high-level signals TRU and TRD are applied to the gates of the transfer MOSFETs Qt1 and Qt1' in order to turn on the transfer MOSFETs Qt1 and Qt1'. The numerical values in the parentheses are data values stored in the data registers DLU and DLD. The operations shown in FIG. 1 are executed by feeding the high-level signal DPU to the gate of the additional circuit Qe1 and the operation results are stored in the data register by feeding the high-level signal DTU to the gate of the transfer MOSFET Qt2.

Figure 6:
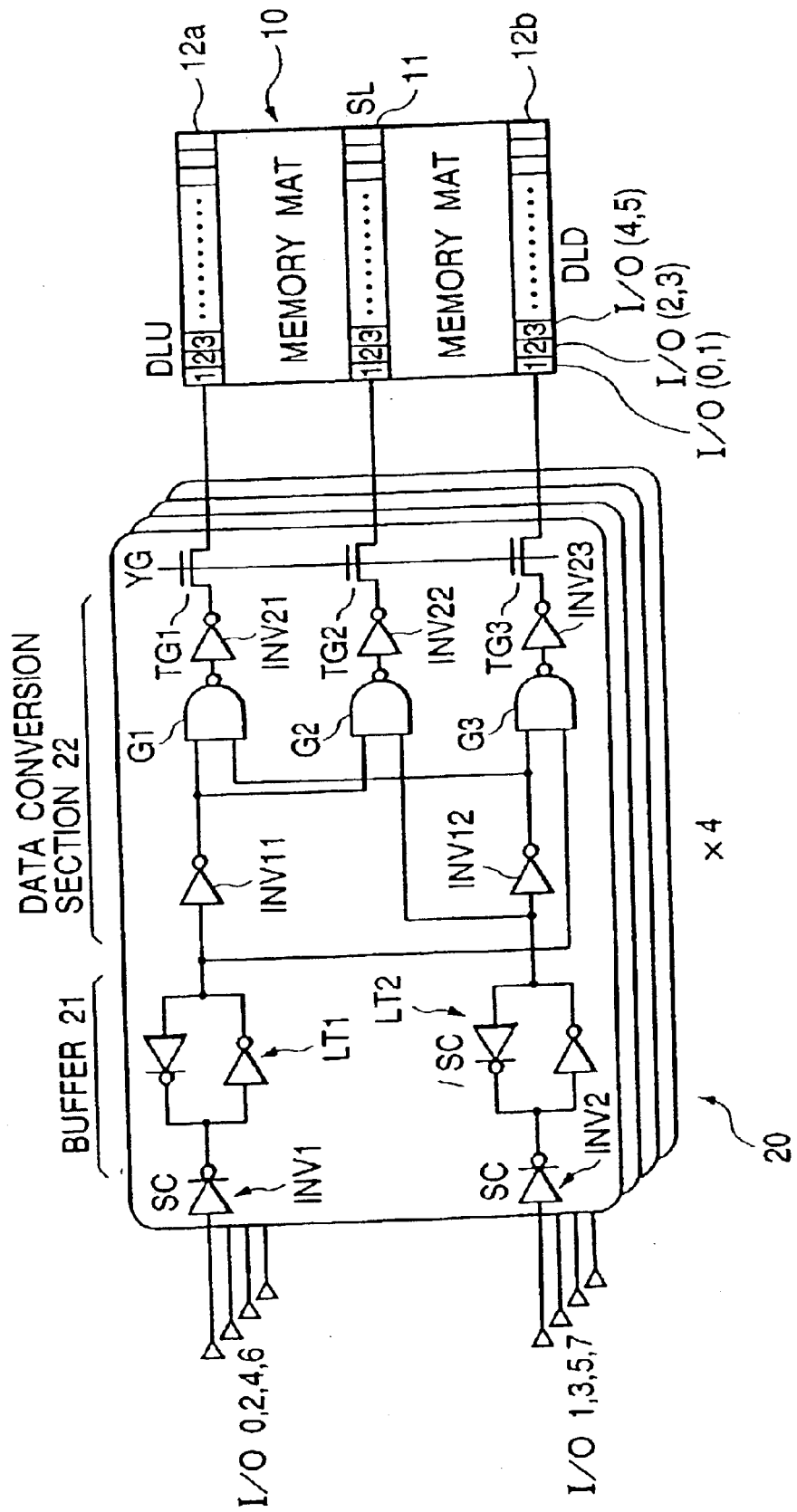
FIG. 6 is a logic circuit diagram showing an example of converting two-bit write data into four-value data in the multiple-value flash memory of the present invention.

FIG. 6 shows the structure of a data conversion circuit 20 for converting the data to be stored, which is input from an external unit, into multiple-value data, and the relation between the data conversion circuit 20 and the data latch arrays 11, 12a and 12b in the memory array 10 is also shown in the figure. The data conversion circuit 20 comprises an input buffer section 21 and a data conversion section 22, and 8-bit data can be input in parallel in pairs of two bits. FIG. 6 shows a set of the input buffer section and the data conversion section in detail. A pair of data conversion circuits will be described below.

The input buffer section 21 in a pair of data conversion circuits comprises two clock inverters INV1 and INV2 and latch circuits LT1 and LT2, and the data conversion section 22 comprises inverters INV11 and INV12 connected to the respective latch circuits LT1 and LT2, three NAND-gate circuits G1, G2, and G3 for receiving the outputs of the two inverters INV11 and the INV12 and the outputs of the above latch circuits LT1 and LT2 as their input signals, inverters INV21, INV22, and INV23 for reversing the outputs of these gate circuits, and transmission gates TG1, TG2, and TG3 comprising MOSFETs connected to the inverters. The data conversion section 22 converts 2-bit input data into 3-bit data, and outputs the data of 3 bits×4 as a whole.

Table 2 shows examples of data conversion performed by the data conversion circuit 20.

TABLE 2

| Write data | I/00 | I/01 | DLU[1] | SL[1] | DLD[1] |
|---|---|---|---|---|---|
| 01 | 0 | 1 | 0 | 1 | 0 |
| 00 | 0 | 0 | 1 | 0 | 0 |
| 10 | 1 | 0 | 0 | 0 | 1 |
| 11 | 1 | 1 | 0 | 0 | 0 |

As shown in Table 2, write data "01" is converted into three-bit data "010", write data "00" is converted into three-bit data "100", write data "10" is converted into three-bit data "001", and write data "11" is converted into three-bit data "000". After the conversion, data is written only in a memory cell corresponding to the bit equivalent to "1" and data is not written in a memory cell corresponding to the bit equivalent to "0".

Eight-bit write data first input to the data conversion circuit 20 through external terminals I/00 and I/01 are converted into three-bit data. The converted data are transferred to and stored in the first latch circuits of data latch arrays 12a (corresponding to the DLU) and 12b (corresponding to the DLD) arranged at both ends (top and bottom in FIG. 6) of the memory array 10 and a sense latch array 11 (corresponding to the SL) arranged at the center of the memory array. Moreover, the write data supplied through external terminals I/02 and I/03 are also converted into three-bit data, and transferred to and stored in the second latch circuits of the data latch arrays 12a and 12b arranged at both ends (top and bottom in FIG. 6) of the memory array 10 and the sense latch circuit arranged at the center of the memory array.

Hereafter similarly, the write data supplied through external terminals I/04 and I/05 are also converted into three-bit data, and transferred to and stored in the third circuits of the data latch arrays 12a and 12b and the sense latch array 11. The write data supplied through external terminals I/06 and I/07 are also converted into three-bit data, and transferred to and stored in the fourth circuits of the data latch arrays 12a and 12b and the sense latch array 11. Then, the input eight-bit write data are converted by the data conversion circuit 20, and transferred to and stored in the fifth to eighth bits of the data latch circuits 12a and 12b and the sense latch circuit 11.

When the above operations are repeated and data are stored in all latch circuits of the data latch arrays 12a and 12b and the sense latch array 11, a control circuit provided in a memory which will be described later starts a write sequence and executes the writing of the data stored in the sense latch array 11, the data stored in the sense latch array 12, and the data stored in the sense latch 11b in this order. Moreover, the control circuit is constituted so as to perform control in accordance with a command input from an external CPU or the like.

Figure 7:
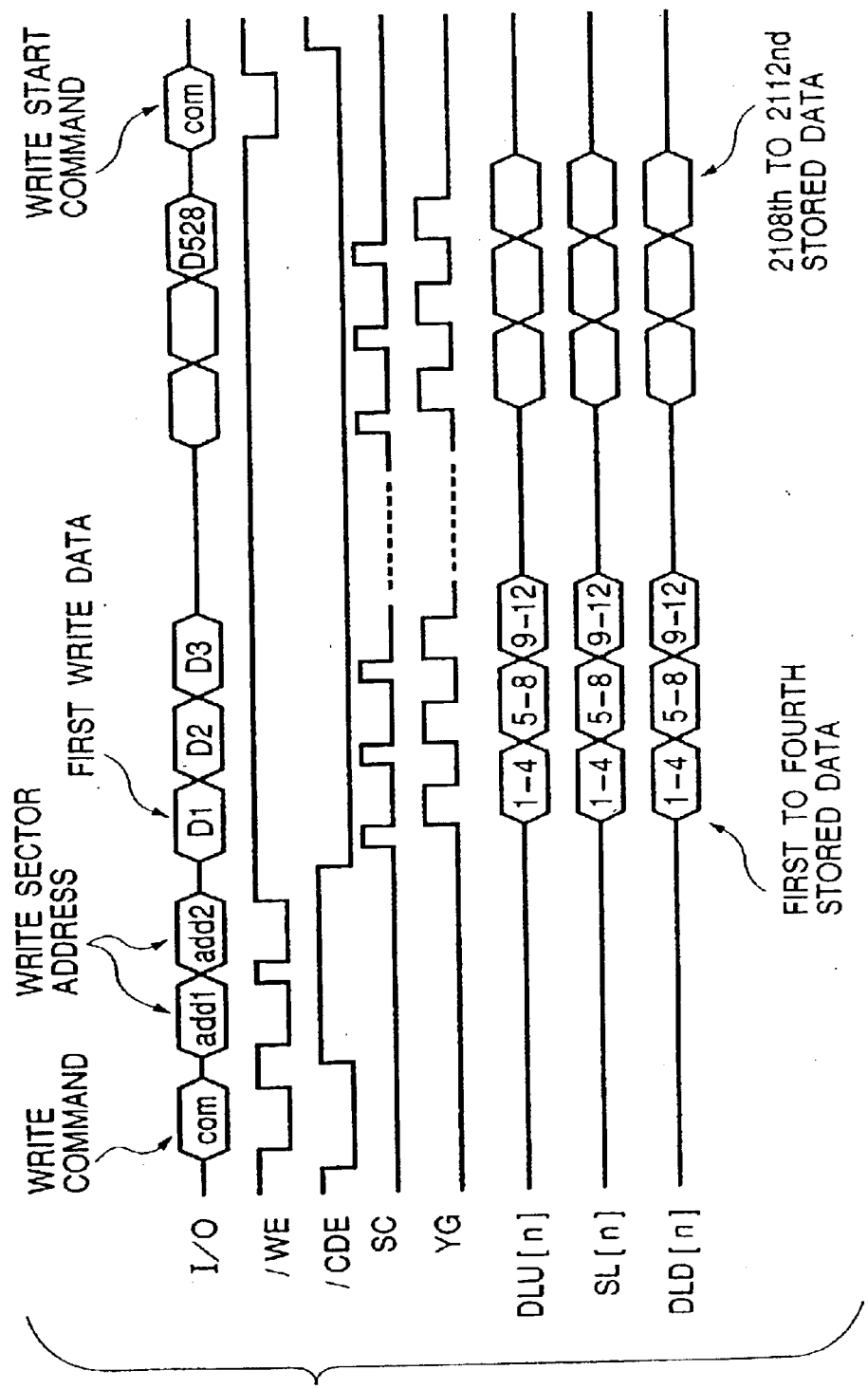
FIG. 7 is a timing chart showing the data input timings during a write operation of the multiple-value flash memory of the present invention.

FIG. 7 shows the timings when data is written. As understood from FIG. 7, when data is written, a write command is first input, and then the sector addresses add1 and add2 of the location where data is to be written are input and captured synchronously with a write enable signal /WE. In this case, the write command is distinguished from the sector addresses in accordance with a control signal (command/data enable signal) /CDE input simultaneously with the write command. That is, it is judged that the command or data is input when /CDE is at a low-level and it is judged that the addresses are input when /CDE is at a high-level.

After the addresses are input, first eight-bit write data D1 to be stored in one sector (memory cell connected to one word line) is input to and captured by the input buffer section 21 synchronously with a clock signal SC. Then, after the data conversion by the data conversion circuit 20, the transmission gates TG1 to TG3 are turned on by a gate control signal YG and the write data values of 3 bits×4 are successively transferred to and stored in the data latch arrays 12a and 12b and the sense latch array 11. Thereafter, the write data values D2, D3, . . . , D528 input in units of eight bits are sequentially data-converted and stored in the sense latch array 11 and the data latch arrays 12a and 12b. When transfer of the write data for one sector is completed, a write start command is input from an external unit and taken in. By decoding the command and executing the write sequence, data for one sector are simultaneously written.

Figure 8:
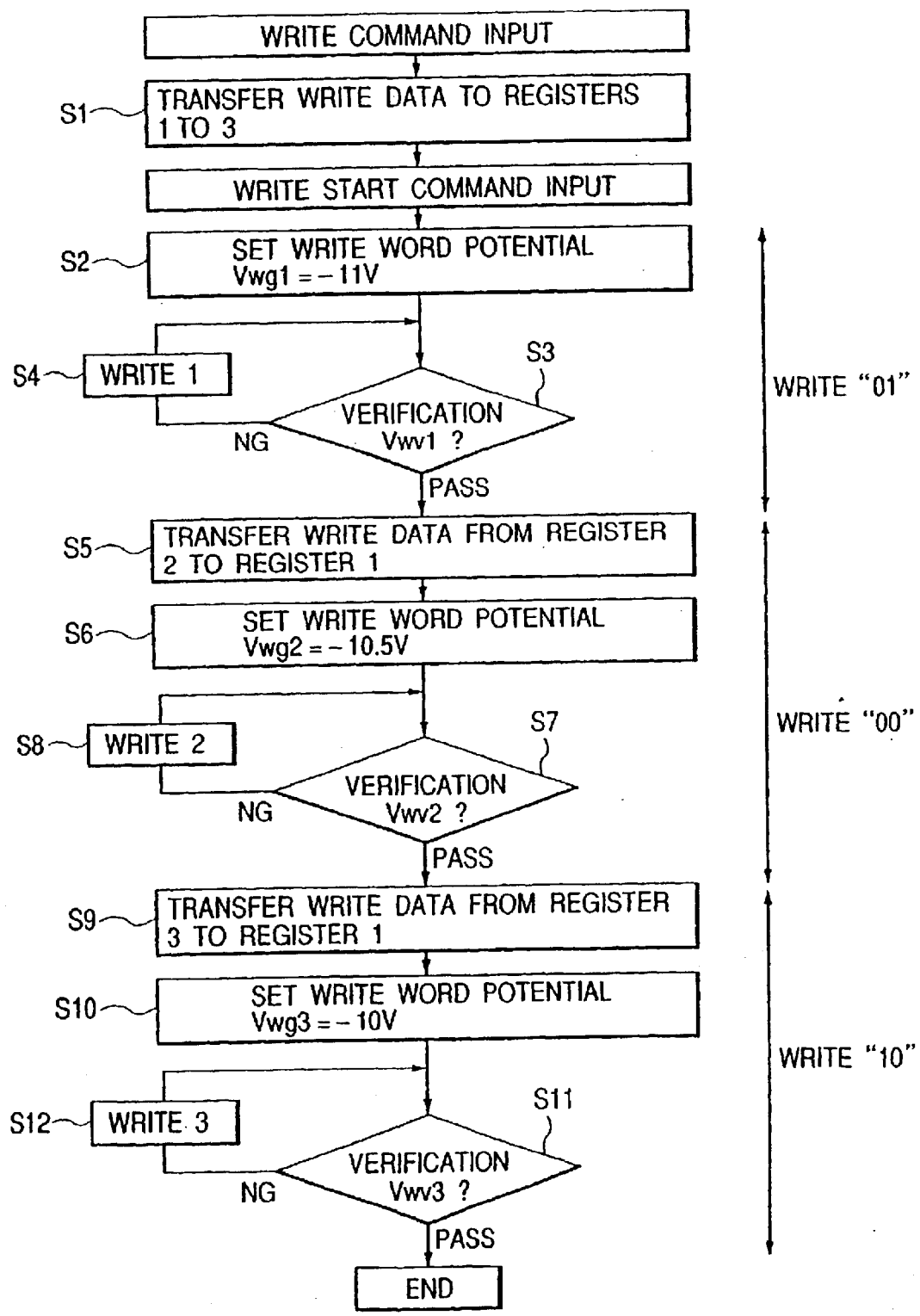
FIG. 8 is a flow chart showing the write procedure of the multiple-value flash memory of the present invention.
Figure 18:
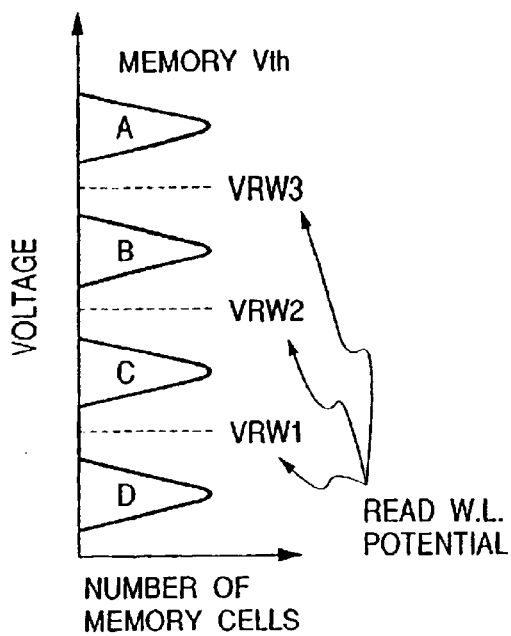
FIG. 18 is a diagram showing memory-cell threshold value distributions for a four-value flash memory.
Figure 19:
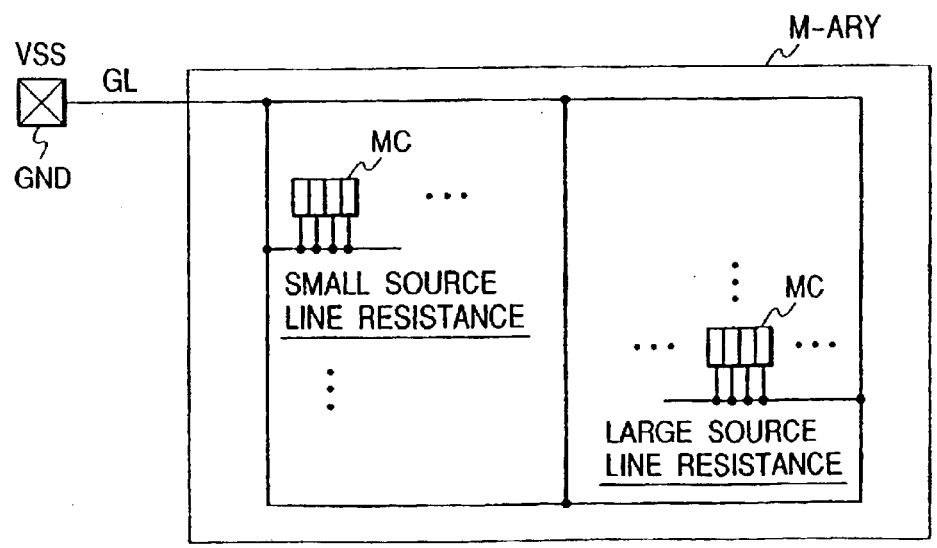
FIG. 19 is a diagram showing the layout of a ground line from a ground pin to a memory cell in a flash memory.
Figure 20:
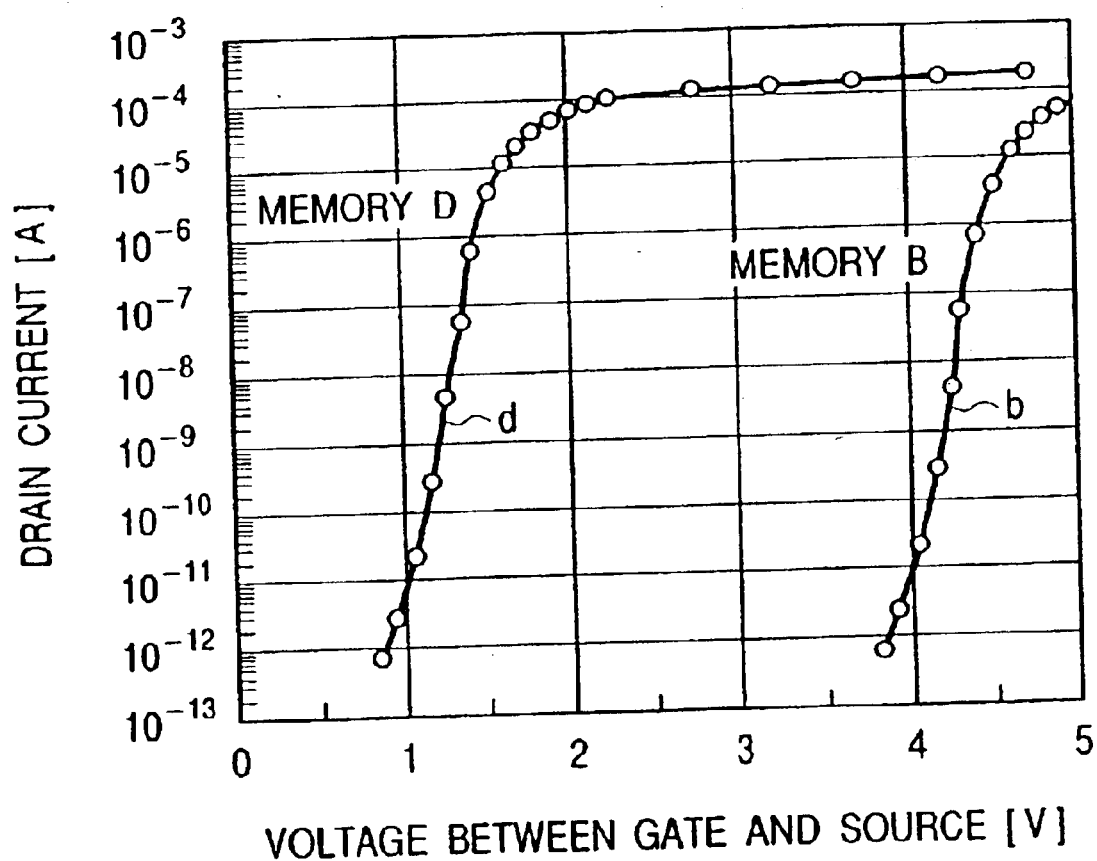
FIG. 20 is a characteristic diagram showing the relation between the gate-source voltage and the drain current of a MOSFET constituting a memory cell of a flash memory.

In the memory array 10, the write operation of memory cells connected to bit lines in which the data stored in the sense latch array 11 and the data latch arrays 12a and 12b are "1" is performed, in other words, write pulses are applied to the memory cells, and the threshold value of each memory cell is shifted to one of the distributions shown in FIG. 18. Thus, it is possible to write four-value data in one memory cell. FIG. 8 shows a write control procedure. It is assumed that the erase operation for bringing the threshold values of all memory cells to the highest state (state corresponding to data "11") is performed before the data write operation is started.

The first step S1 in FIG. 8 (Transferring the write data to latches 1 to 3.) is the transfer of data from the data conversion circuit 20 to the sense latch array 11 and the data latch arrays 12a and 12b, and the second step S2 and subsequent steps are the control sequence to be started when the write command is input.

In this control sequence, a word line selected by decoding an already-captured write address is set at a potential such as −11V (step S2). At the same time, the transfer MOSFET Qt1 on a bit line is turned on, and a bit line in which the data is "1" in accordance with the data stored at this time in the sense latch array 11 is set at a potential such as 5 V to perform the write operation. Then, the bit line is precharged to a potential such as 1 V, and then the selected word line is set at a write verify voltage VWW1 such as 1.0 V to perform the verify read operation. In this case, the data read from a memory cell in which the write operation is normally completed and stored in the sense latch array 11 changes to "0". Then, it is judged whether or not all data stored in the sense latch array 11 are "0" (step S3). Then, if even one data of "1" remains, the write operation is performed again by using the data then stored in the sense latch array 11 (step S4).

When all data in the sense latch array 11 are determined to be "0" as a result of verification, step 5 is started to transfer the data stored in the data latch array 12a to the sense latch array 11. Then, the selected word line is set at a potential such as −10.5 V which is slightly lower than the potential previously set (step S6). Then, the write operation is performed in accordance with the data stored in the sense latch array 11, and thereafter the selected word line is set at a write verify voltage VWW2 such as 2.0 V and the verify read operation is performed to judge whether or not all the data stored in the sense latch array 11 are "0" (step S7). If even one data value of "1" remains, the write operation is performed again by using the data then stored in the sense latch array 11 (step S8).

When all the data in the sense latch array 11 are determined to be "0" as a result of verification, step 9 is started to transfer the data stored in the data latch array 12b to the sense latch array 11. Then, the selected word line is set at a potential such as −10 V which is even lower than the previous value (step S10). Then, the write operation is performed in accordance with the data stored in the sense latch array 11, and thereafter the selected word line is set at a verify voltage VWW3 such as 3.0 V and the verify read operation is performed to judge whether or not all the data stored in the sense latch array 11 are "0" (step S11). Then, if even one data of "1" remains, the write operation is performed again by using the data then stored in the sense latch array 11 (step S12).

The write operation is executed starting with a memory cell having a threshold value farthest from the erase level and ending with a memory cell having a threshold value nearest to the erase level in order according to the above procedure. Thereby, it is possible to decrease the frequency of the word-line disturbance of the memory cell having a threshold value nearest to the erase level and minimize the threshold value fluctuation due to word-line disturbance. Moreover, in the case of the above embodiment, the absolute value of the write word line voltage is gradually lowered to −11 V, −10.5 V, and −10 V. Therefore, the amount of disturbances produced once also gradually decreases and, therefore, it is possible to further decrease the threshold value fluctuation. However, it is also possible to gradually decrease the write pulse width instead of gradually lowering the write voltage.

Figure 9:
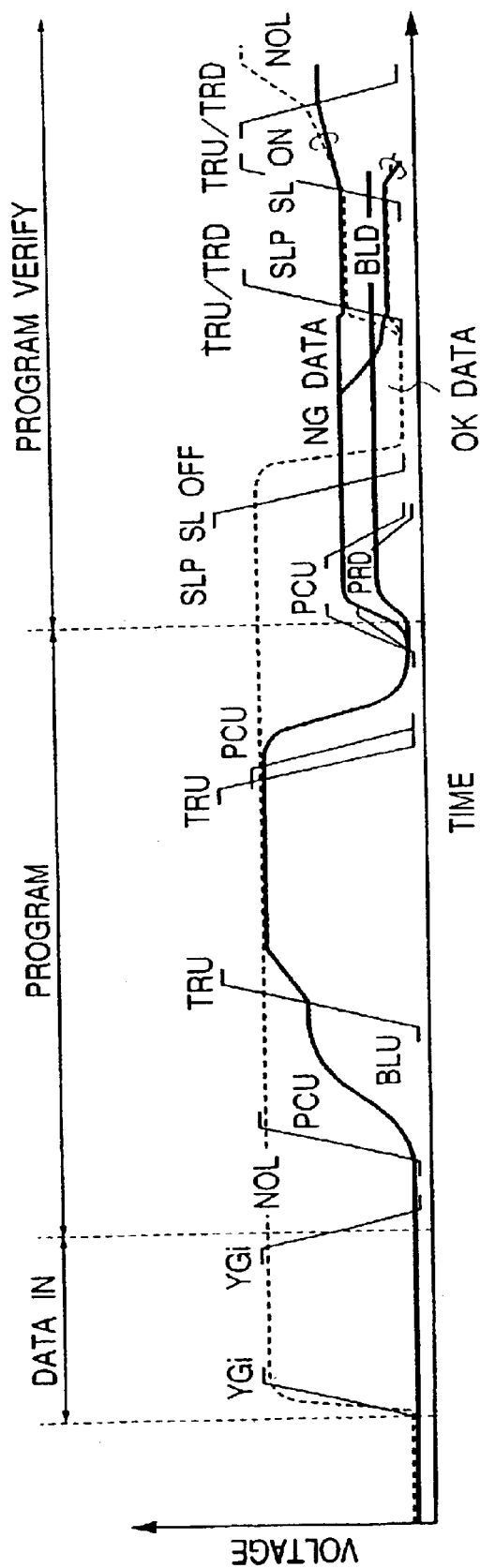
FIG. 9 is a timing chart showing the signal timing during a data write operation.

FIG. 9 shows the voltage change of signal lines in the memory array and the sense latch circuits when data is written (when data is written in memory cells in the upper memory mat).

Symbols shown in FIG. 9 correspond to those shown in FIG. 4. Symbol YGi denotes a gate control signal of the column switch Qy, NOL denotes the potential of the input/output node Nb of a sense latch, BLU denotes the potential of the selected-side bit line, BLD denotes the potential of the non-selected-side bit line, TRU and TRD denote gate control signals of the transfer MOSFETs Qt1' and Qt1, PCU denotes a gate control signal of the precharge MOSFET (Qp1') of the selected-side bit line, PRD denotes a gate control signal of the half-precharge MOSFET Qp2 of a non-selected-side bit line, RSAU and RSAD denote gate control signals of the discharge MOSFETs Qd1 and Qd1', and SLP and SL denote the power supplies of a flip-flop FF1 of a sense latch.

Figure 10A:
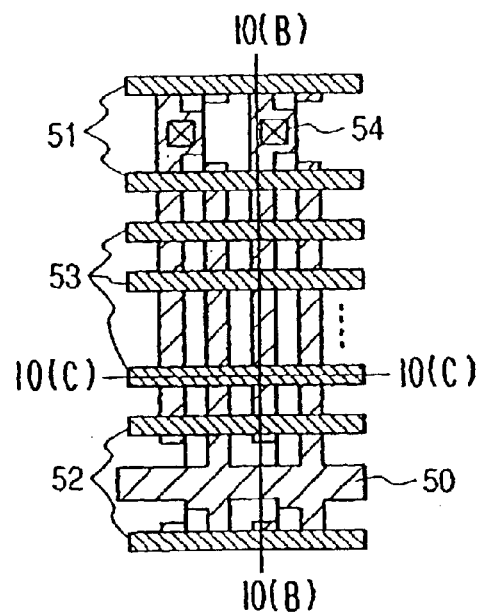
FIGS. 10(A) to 10(D) are diagrams showing a layout structure and a sectional structure of a memory cell according to the present invention.
Figure 10B:
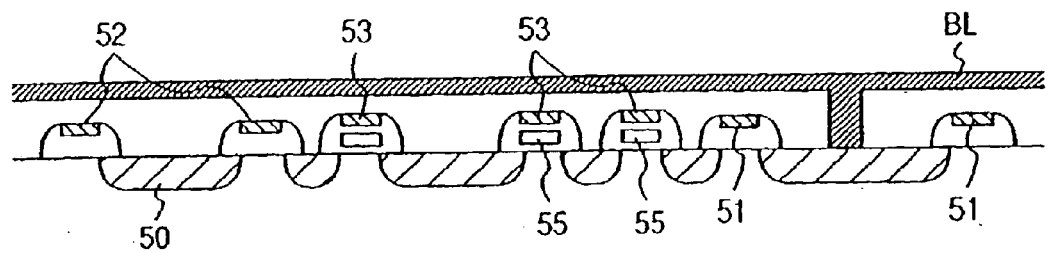
Figure 10C:
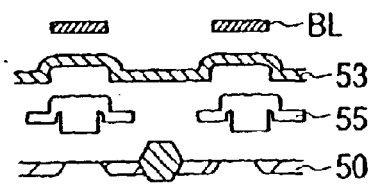
Figure 10D:
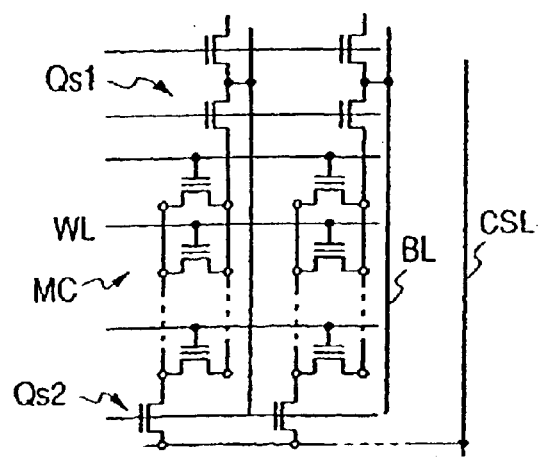

FIG. 10(D) shows an example of the layout structure and FIG. 10(A) to FIG. 10(C) show the sectional structure of a memory cell of the above embodiment. In FIG. 10(A) to FIG. 10(C), symbol 50 denotes a diffusion layer serving as the source and drain regions of a memory cell MC and selection switch MOSFETs Qs1 and Qs2, 51 and 52 denote gate electrodes of selection switch MOSFETs Qs1 and Qs2 made of polysilicon or tungsten silicide, 53 denotes a control gate electrode (word line) of a MOSFET constituting a memory cell, and 54 denotes a contact hole for connecting the source regions of selection switch MOSFETs Qs1 and Qs2 with a bit line BL. FIG. 10(B) is a sectional view along the line X—X in FIG. 10(A) and FIG. 10(C) is a sectional view along the line Y—Y in FIG. 10(A). As shown in FIG. 10(B), the bit line BL is provided above the control gate electrode 53 in such a way as to perpendicularly intersect the electrode 53. The bit line BL is constituted of, for example, an aluminum layer. As shown in FIG. 10(C), a floating gate electrode 55 made of polysilicon is formed below the control gate electrode 53.

Figure 11A:
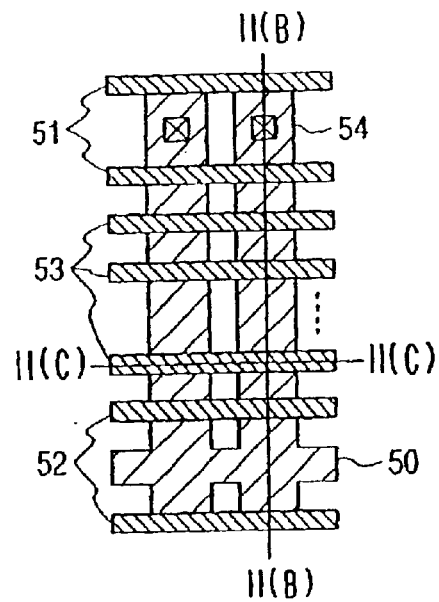
FIGS. 11(A) to 11(D) are diagrams showing a layout structure and a sectional structure of another embodiment of the memory cell.
Figure 11B:
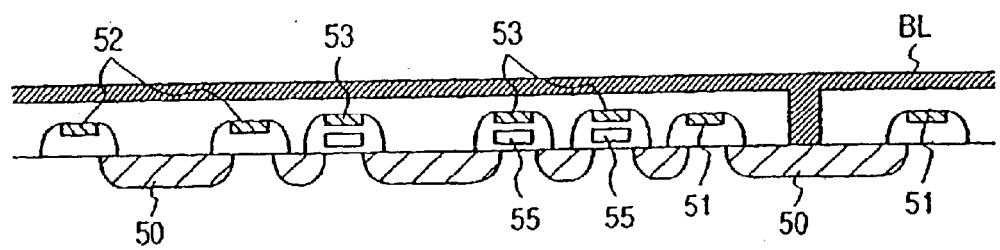
Figure 11C:
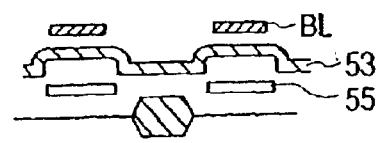
Figure 11D:
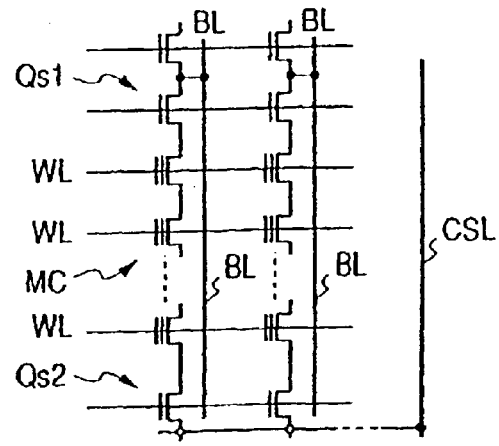

FIGS. 11(D) to 13(D) show other embodiments of a memory array. FIG. 11(D) shows an example of the layout structure and sectional structure of a memory cell of a memory array called a NAND type. In the NAND-type memory array, as shown in FIG. 11(D), a plurality of memory cells MC are connected in series between selection switch MOSFETs Qs1 and Qs2 connected to a bit line BL and a common source line CSL. Similarly to the embodiment of FIG. 10(A), symbol 50 in FIGS. 11(A) to 11(C) denotes a diffusion layer serving as the source and drain regions of the memory cells MC and the selection switch MOSFETs Qs1 and Qs2, 51 and 52 denote the gate electrodes of the selection switch MOSFETs Qs1 and Qs2 made of polysilicon or tungsten silicide, 53 denotes the control gate electrode (word line) of the MOSFET constituting a memory cell MC, and 54 denotes contact holes for connecting the source regions of the selection switch MOSFETs Qs1 and Qs2 with the bit line BL. FIG. 11(B) is a sectional view along the line X—X in FIG. 11(A), and FIG. 11(C) is a sectional view along the ling Y—Y in FIG. 11(A). As shown in FIG. 11(B), the bit line BL is provided above the control gate electrode 53 in such a way as to perpendicularly intersect the electrode 53. The bit line BL is constituted of, for example, an aluminum layer. As shown in FIG. 11(C), a floating gate 55 is formed below the memory-cell control gate electrode 53. In the embodiment in FIG. 11(D), however, when each memory cell is turned on, a bit-line discharge current flows in the direction of arrangement of the control gate electrodes (horizontal direction in FIG. 10(A)). In the embodiment in FIG. 11(D), however, when each memory cell is turned on, the current flows in the direction perpendicular to the arrangement of the control gate electrode (vertical direction in FIG. 11(A)). Also in this embodiment, the floating gate electrodes 55 are made of polysilicon.

Figure 12A:
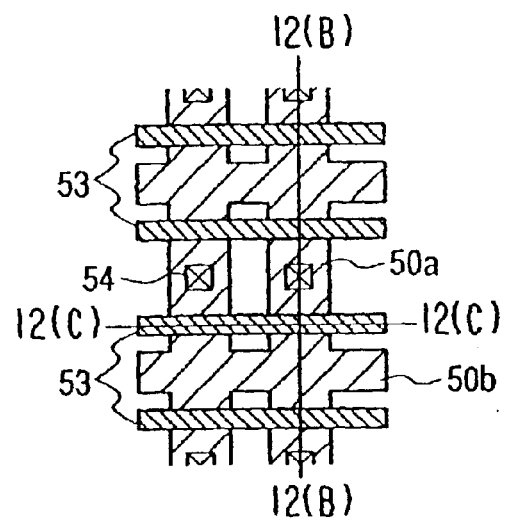
FIGS. 12(A) to 12(D) are diagrams showing a layout structure and a sectional structure of still another embodiment of the memory cell.
Figure 12B:
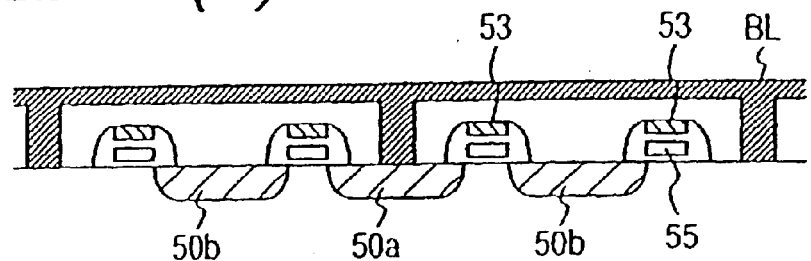
Figure 12C:
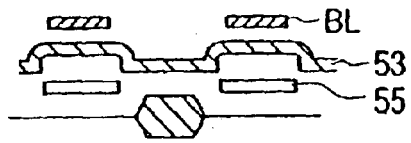
Figure 12D:
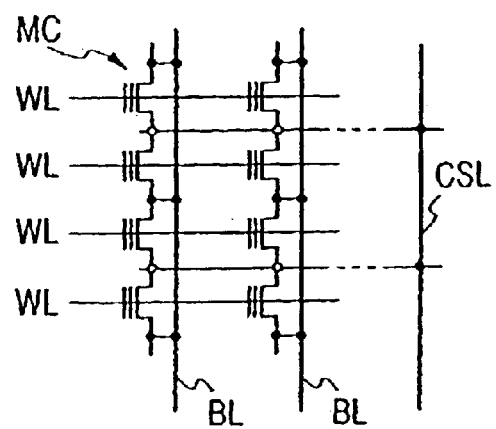

FIG. 12(D) shows the layout structure and FIGS. 12A to 12(C) show the sectional structure of a memory cell of a memory array called a NOR type. The NOR-type memory array, as shown in FIG. 12(D), is so constituted that a plurality of memory cells are connected in series, the source and drain terminals of adjacent memory cells are made to serve as common terminals, and the common terminals are connected alternately to a bit line BL and a common source line CSL. In FIGS. 12(A) to 12(C), symbol 50a denotes a diffusion layer serving as a drain region common to memory cells MC, 50b denotes a diffusion layer serving as a source region common to the memory cells MC, 53 denotes a control gate electrode (word line) of a memory cell MC made of polysilicon or tungsten silicide, and 54 denotes a contact hole for connecting the drain region 50 common to the memory cells MC with the bit line BL. In the embodiment, the source region 50b common to the memory cells MC also serves as the common source line CSL.

FIG. 12(B) is a sectional view along the line X—X in FIG. 12(A), and FIG. 12(C) is a sectional view along the line Y—Y in FIG. 12(A). As shown in FIG. 12(B), the bit line BL is provided above the control gate electrode 53 in such a way as to perpendicularly intersect the electrode 53. The bit line BL is constituted of, for example, an aluminum layer. As shown in FIG. 12(C), a floating gate 55 is formed below the memory-cell control gate 53. Also, in the embodiment, the floating gate 55 is made of polysilicon.

Figure 13A:
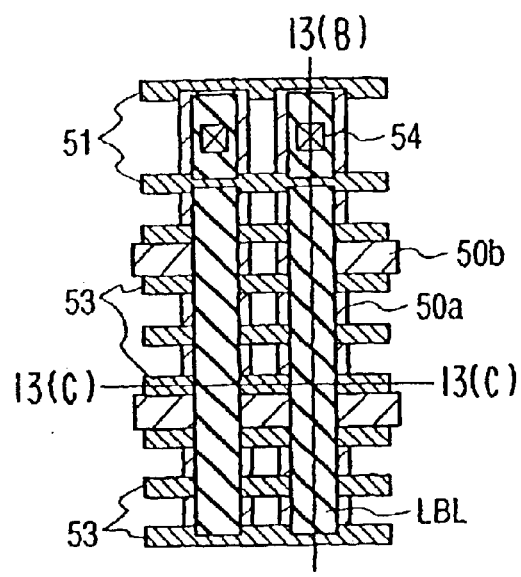
FIGS. 13(A) to 13(D) are diagrams showing a layout structure and a sectional structure of still another embodiment of the memory cell.
Figure 13B:
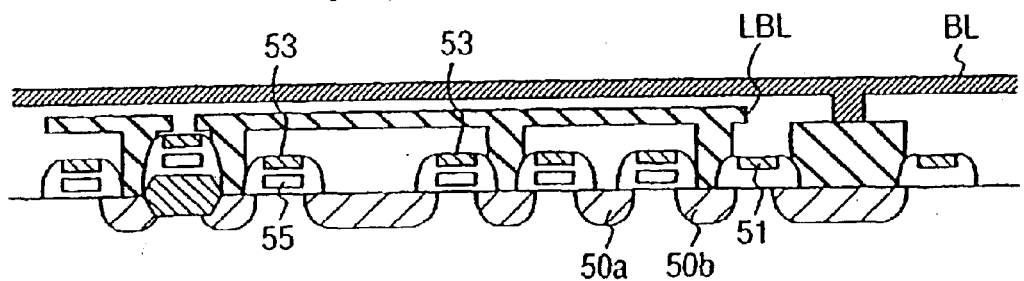
Figure 13C:
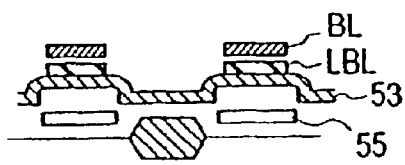
Figure 13D:
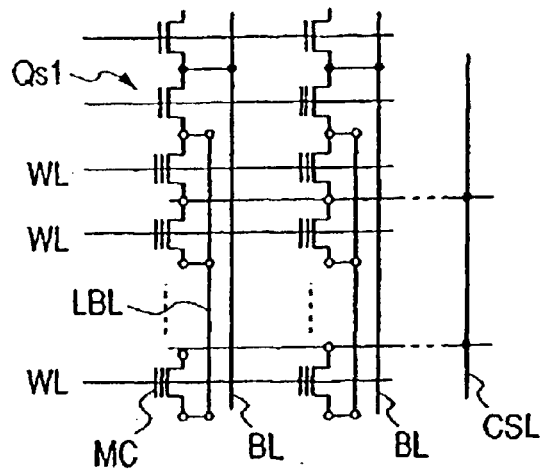

FIG. 13(D) shows an example of the layout structure and FIGS. 13(A) to 13(C) show the sectional structure of a memory cell of a memory array called a DINOR type. The DINOR-type memory array, as shown in FIG. 13(D), is constituted by using the NOR type as the basic structure and adding a local bit line LBL to the basic structure. That is, a plurality of memory cells are connected in series, the source and drain terminals of adjacent memory cells are made to serve as common terminals, the common terminals are alternately connected to the local bit line LBL and common source line CSL, and a selection switch MOSFET Qs1 is connected between the local bit line LBL and the bit line BL.

In FIG. 13(A), symbol 50a denotes a diffusion layer serving as the drain region common to memory cells MC, 50b denotes a diffusion layer serving as the source region common to the memory cells MC, 51 denotes the gate electrode of the selection switch MOSFET Qs1, 53 denotes the control gate electrode (word line) of a memory cell MC made of tungsten silicide, and 54 denotes a contact hole for connecting the drain region of the selection switch MOSFET Qs1 with the bit line BL. In the embodiment, the source region 50b common to the memory cells MC also serves as the common source line CSL.

FIG. 13(B) is a sectional view along the line X—X in FIG. 13(A) and FIG. 13(C) is a sectional view along the line Y—Y in FIG. 13(A). As shown in FIG. 13(B), the local bit line LBL is provided above the control gate electrode 53 in such a way as to perpendicularly intersect the electrode 53, and the bit line BL is provided above the local bit line LBL almost in parallel with the line LBL. In the embodiment, the local bit line LBL is constituted of, for example, a polysilicon layer and the bit line BL is constituted of, for example, an aluminum layer. As shown in FIG. 13(C), a floating gate electrode 55 is formed below the memory-cell control gate 53.

Figure 14:
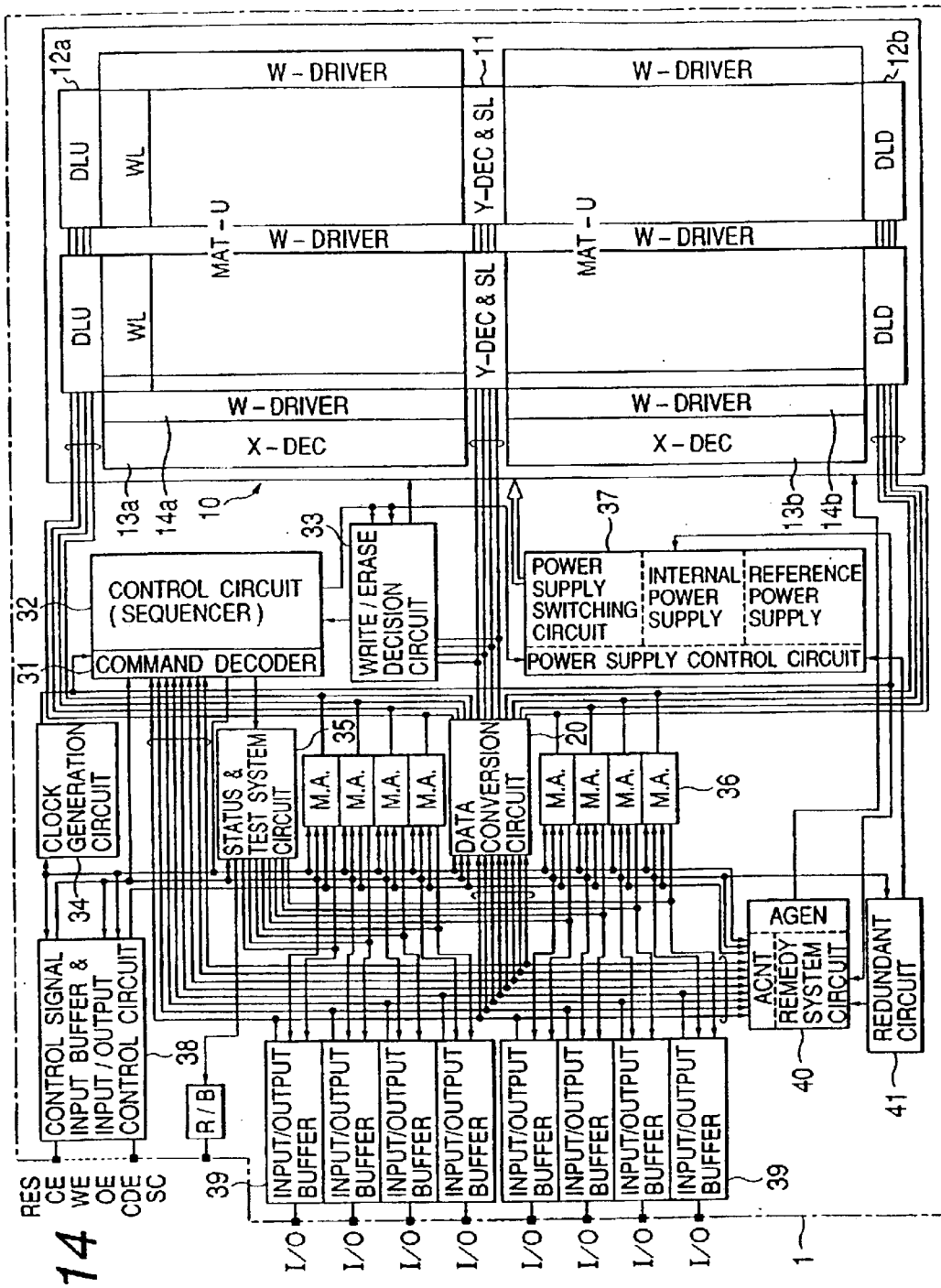
FIG. 14 is a block diagram showing the outline of the embodiment of a multiple-value flash memory of the present invention.

FIG. 14 shows an example of the overall structure of a multiple-value flash memory having a memory array 10, a data conversion circuit 20, a control circuit, and memory peripheral circuits on the same semiconductor chip.

Though the invention is not so restricted, the flash memory of this embodiment is provided with a command decoder 31 for decoding a command given from an external CPU or the like and a control circuit (sequencer) 32 for successively generating control signals for each circuit in the memory in order to execute the processing corresponding to the command in accordance with the decoding results by the command decoder 31, and is so constituted as to automatically execute a corresponding processing by decoding the given command. The control circuit 32 comprises a ROM (read only memory) storing a series of micro-instructions necessary to execute a command (instruction) similar to, for example, the control section of a microprogram-type CPU, and is so constituted that a microprogram is started when the command decoder 31 generates the first address of micro-instructions corresponding to a command and outputs it to the control circuit 32.

In FIG. 14, circuit sections denoted by the same symbols as those in FIG. 4 are circuits having the same functions. That is, symbol 10 denotes a memory array constituted of two memory mats MAT-U and MAT-D, 20 denotes a data conversion circuit for converting the write data input from an external unit into four-value data, 11 denotes a sense latch array for storing the converted write data or read data, and 12a and 12b denote data latch arrays.

The memory array 10 is provided with X-system address decoders 13a and 13b correspondingly to the memory mats MAT-U and MAT-D and word drive circuits 14a and 14b for driving one word line WL in each memory mat to a selection level in accordance with the decoding result by the decoder 13a or 13b. In the memory array 10 of this embodiment, though the invention is not so restricted, the word drive circuit is provided on both sides and at the center of each memory mat. Though not shown in FIG. 3 or 4, a Y-system address decoder circuit and a column switch to be selectively turned on/off by the decoder to transfer the data supplied from the data conversion circuit 20 to a corresponding sense latch are provided integrally with the sense latch array 11. In FIG. 9, the Y-system decoder circuit, column switch, and sense latch circuit are shown as one functional block Y-DEC&SL.

The multiple-value flash memory of the embodiment is provided with, in addition to the above circuits, a write/erase decision circuit 33 for judging whether or not the write or erase operation is completed in accordance with the data supplied from the sense latch array 11 at the time of the write or erase operation and for transmitting the decision results to the control circuit 32 to complete a write or erase sequence, a clock generation circuit 34 for generating timing clock signals necessary for internal operations and for supplying them to the circuits in the memory, a status & test system circuit 35 provided with functions of reflecting the internal state of the memory, generating a ready/busy signal R/B showing an external unit whether the memory can be accessed from the external unit or not and outputting the signal, and testing internal circuits, a main amplifier circuit 36 for amplifying a signal read from the memory array 10, a power-supply-system circuit 37, an input/output buffer circuit 38 for capturing an address signal, a write data signal, and a command input from an external unit to supply them to internal predetermined circuits and outputting a read data signal to an external unit, a control signal input buffer & input/output control circuit 39 for capturing control signals input from external units to supply them to the control circuit 32 and other internal predetermined circuits and controlling the input/output buffer circuit 38, an address-control-system circuit 40, and a redundant circuit 41 for replacing a defective memory row with a spare memory row if there is any defective bit in the memory array.

In the flash memory of this embodiment, an external terminal (pin) I/O is shared by an address signal, write data signal, and command input. Therefore, the input/output buffer circuit 38 separately captures these signals in accordance with control signals supplied from the control-signal input buffer & input/output control circuit 39 and supplies them to a predetermined internal circuit. Moreover, the power-supply-system circuit 37 comprises a reference-voltage generation circuit for generating a reference voltage for a substrate potential, an internal power supply generation circuit including a charge pump for generating voltages, such as a write voltage, erase voltage, read voltage, and verify voltage, which are required in the chip from the power supply voltage Vcc supplied from an external unit, a power-supply switching circuit for selecting a necessary voltage out of these voltages in accordance with the operating state of the memory, and a power-supply control circuit for controlling these circuits.

The address-control-system circuit 40 comprises an address counter ACNT for capturing address signals input from an external unit and for counting them, an address generator AGEN for automatically updating the Y-address when transferring data and for automatically generating an X-address when erasing data, and a remedy system circuit for comparing the input address with a defective address and for switching a selected memory row or column when the input address coincides with the defective address.

A reset signal RES, chip selection signal CE, write control signal WE, output control signal OE, command enable signal CDE for indicating a command, data input, or address input, and system clock signal SC are control signals to be input to the flash memory of this embodiment from an external CPU or the like.

Figure 15:
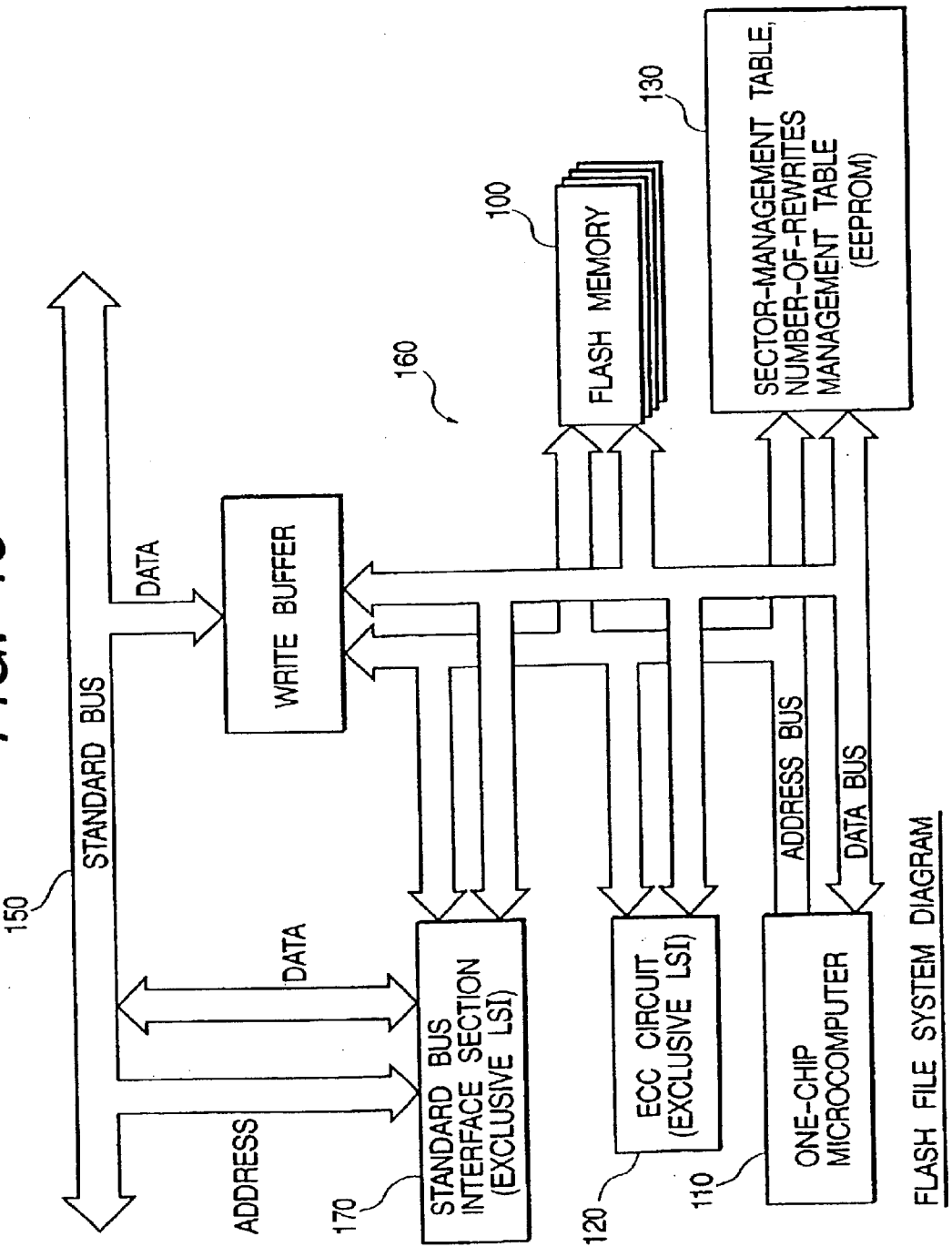
FIG. 15 is a block diagram showing a system to which a multiple-value flash memory of the present invention is applied.
Figure 16:
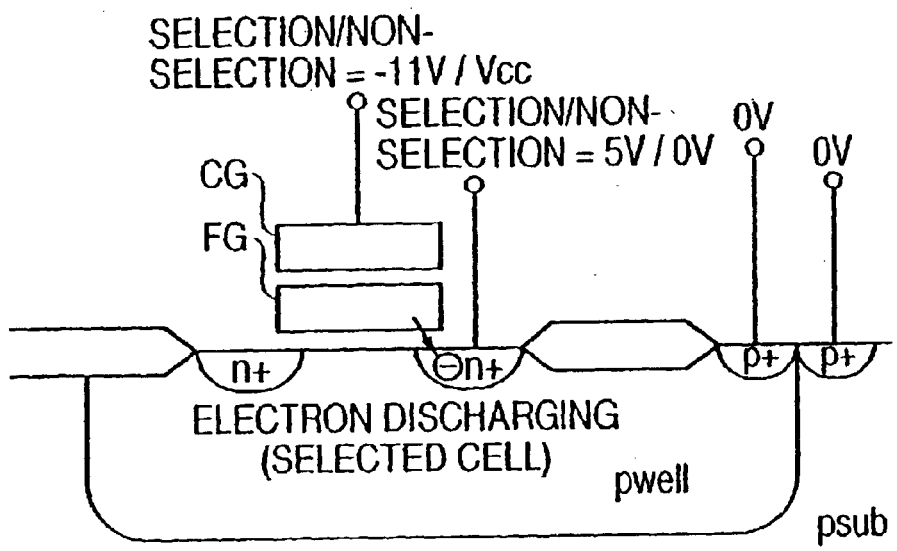
FIG. 16 is a schematic diagram showing the structure of a memory cell used for the flash memory of the present invention and the voltage state at the time of a data write operation.
Figure 17:
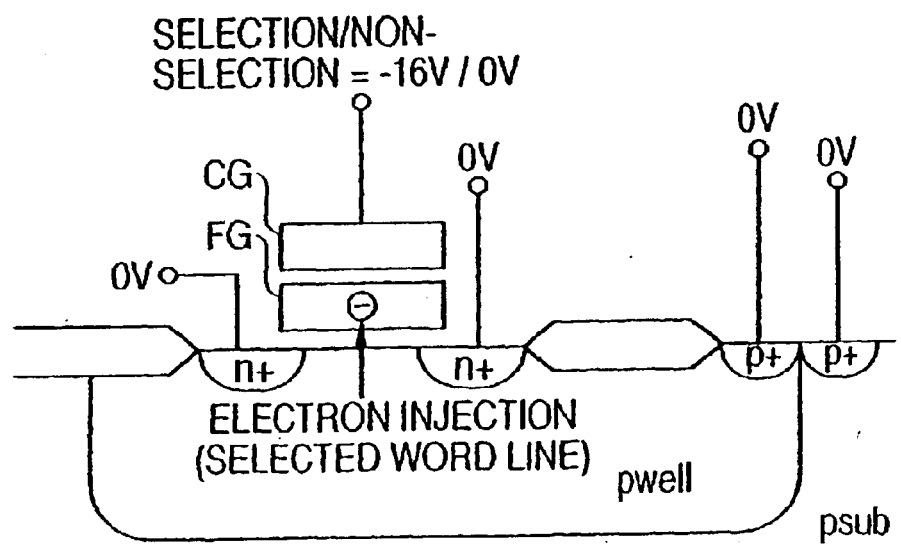
FIG. 17 is a schematic diagram showing the voltage state of a memory cell used for the flash memory of the present invention at the time of an erase operation.

A general-purpose microcomputer LSI can be used as an external unit for controlling the multiple-value flash memory of the above embodiment because the external unit need have only an address generating function and a command generating function. FIG. 15 shows an example of the structure of a system using the flash memory as its memory. This system is preferably used as the control system of a portable telephone set because data is kept in the system even if the power supply is turned off. In FIG. 15, symbol 100 denotes a flash memory, 110 denotes a one-chip microcomputer for mainly controlling the data read, data write, and data erase operations of the flash memory 100, 120 denotes an ECC (error correcting code) circuit for generating an error correction code when data is written in the flash memory and for checking read data to correct errors when data is read from the flash memory, 130 denotes a control table memory comprising an EEPROM to store the data rewriting frequency of the flash memory 110 in the form of a table, 140 denotes a write buffer for temporarily storing the write data supplied from a not-illustrated external microprocessor through a standard bus 150, 160 denotes a local bus for connecting the one-chip microcomputer 110, memories 100 and 130, and ECC circuit 120 to one another, 170 denotes a bus interface circuit serving as an interface for signals transferred between the local bus 160 and the standard bus 150.

As described above, in a nonvolatile semiconductor memory according to this embodiment for storing multiple-value information in one memory cell by setting a plurality of threshold values, data is successively read while changing the word line read level from low to high level, and latch means for storing the read data is provided to selectively precharge the next bit line in accordance with the stored data. Therefore, for a memory cell from which "0" is once read, "0" is read again from the memory cell even after the level is raised. Thus, the same result as that when the read operation is not performed is obtained and, thereby, it is possible to omit precharging of a bit line. Moreover, because the current consumption can be reduced by omitting the precharging, it is possible to reduce the current flowing out to the ground line from the memory array in the read operation and, thereby, decrease the rise of the source potential of the memory cell and, thus, prevent the read operation from failing or data from being erroneously read.

Moreover, since the read frequency can be decreased by omitting the precharging, there is an advantage that threshold value fluctuation due to a read disturbance, that is, an unwanted change of stored data, can be suppressed.

Furthermore, according to the above read method, because every read data becomes "0" only for low-threshold memory cells before data is read from the final memory cell, it is possible to interrupt the read operation by using all-"0" decision means. Thus, there are advantages that the current consumption can be reduced and the data read time can be decreased.

Furthermore, because thresholds and stored data values of memory cells are arranged so that the code of stored data is different only in one bit between adjacent thresholds, even if a read disturb condition occurs, there are advantages in that the load of an error correction circuit for correcting the read disturb condition is decreased and the circuit scale is decreased.

Furthermore, in the above embodiment, the memory array is constituted of two mats, a sense latch circuit capable of holding one bit out of three bit data, which is read when the bit line in each mat is connected to an input/output terminal, is provided between the two mats, a data latch circuit capable of holding another bit out of the three bit data read by the sense latch is provided outside each mat, and data is transferred between the data latch circuit and the sense latch circuit through a bit line. Therefore, there is an advantage that it is unnecessary to provide a register for storing read data on the output circuit side.

The invention made by the present inventor has been specifically described above in accordance with various embodiments. However, the present invention is not restricted to the embodiments. It is needless to say that various modifications of the present invention are allowed as long as they do not depart from the gist of the present invention. For example, in the above embodiments, a memory cell has four levels of threshold value, so that four-value data can be stored in one memory cell. However, it is also possible to apply the present invention to a nonvolatile memory capable of storing data of three or more bits by setting the threshold value of a memory cell at one of 8 or 16 levels.

Moreover, in the above embodiments, the conversion shown in Table 2 is performed as an example of methods for converting two-bit data into four-value data. However, the conversion method used by the present invention is not restricted to the method shown in Table 2. Any method can be used as long as the method makes it possible to obtain data such that the position of a bit whose value is "1" is different. Moreover, the operation for data reverse conversion is not restricted to the operation of the method of the embodiments (wired logic method using bit lines). Any method using an exclusive operation circuit or data conversion circuit can be used as long as the method can restore two-bit data.

Furthermore, the method of writing data into each memory cell is not restricted to the method of performing an erase operation to raise the threshold value and then lower the threshold value with a write pulse. It is also possible to use a method of raising the threshold value with a write pulse. Furthermore, though the threshold value is changed by writing data into a memory cell corresponding to the sense latch circuit holding data "1" in the case of the embodiments, it is also possible to change the threshold value by writing data into a memory cell corresponding to the sense latch circuit holding data "0".

Furthermore, in the above embodiments, a memory array is constituted of two mats. However, the present invention is not restricted to such an arrangement. It is possible to apply the present invention to not only a memory array constituted of an even number of mats, but also a memory array constituted of one mat. When a memory array is constituted of one mat, it is necessary to use a method of separating the data converted by a data conversion circuit into two parts and transferring the two parts of data twice.

In the above description, the invention made by the present inventor is applied to a batch-erasing flash memory in the utilization field which is the background of the present invention. However, the present invention is not restricted to the above. The present invention can be widely applied to a general nonvolatile memory using a MOSFET having a floating gate as a memory cell and, moreover, to a semiconductor device provided with a memory cell having a plurality of threshold values.

Advantages obtained from a representative one of the embodiments disclosed in this application will be described below.

That is, the present invention makes it possible to realize a multiple-value nonvolatile semiconductor memory in which the read time and the current consumption are decreased, the necessary read frequency is minimized, and unwanted change of stored data does not occur.

Moreover, the present invention makes it possible to realize a multiple-value nonvolatile semiconductor memory capable of preventing the source potential from rising in the read operation and of preventing data read operation from failing or data from being erroneously read.

What is claimed is:

1. A nonvolatile memory system comprising:
    a controller; and
    a nonvolatile memory,
    wherein said controller is capable of controlling performing operations of said nonvolatile memory, one of which operations being a read operation to read data stored in said nonvolatile memory,
    wherein said nonvolatile memory comprises a plurality of nonvolatile memory cells, a plurality of sense circuits and a decision circuit,
    wherein each of said nonvolatile memory cells has a threshold voltage within one of a plurality of threshold voltage distributions,
    wherein each of said sense circuits connects to a corresponding one of said nonvolatile memory cells and is capable of outputting a signal which has one of a first level or a second level according to data stored in said corresponding nonvolatile memory cell, and
    wherein, in performing said read operation, said decision circuit outputs one of a first signal or a second signal, said first signal indicating that all of said sense circuits output said first level signal and said second signal indicating that at least one of said sense circuits outputs said second level signal.

2. A nonvolatile memory system according to claim 1,
    wherein said nonvolatile memory comprises a plurality of word lines, each of which connects to corresponding ones of said nonvolatile memory cells,
    wherein, in performing said read operation, one of said word lines is applied with a read voltage, and
    wherein said sense circuit outputs said first level signal when connected to one of said nonvolatile memory cells which has said threshold voltage lower than said read voltage, and outputs said second level signal when connected to one of said nonvolatile memory cells which has said threshold voltage higher than said read voltage.

3. A nonvolatile memory system according to claim 2,
    wherein said controller controls performing a program operation, which is one of said performing operations, and includes a data storing operation and a verify operation.

4. A nonvolatile memory system according to claim 3,
    wherein, a first distribution of said threshold voltage distributions is a lowest voltage level, a second distribution is a higher voltage level than said first distribution and a third distribution is a higher voltage level than said second distribution, and
    wherein said read voltage has a plurality of voltage levels including a first voltage level which is between said first distribution and said second distribution and a second voltage level which is between said second distribution and a third distribution.

5. A nonvolatile memory system according to claim 4,
    wherein verify voltage of said verify operation has a plurality of voltage levels including a first verify voltage level which is between said first distribution and said second distribution and a second verify voltage level which is between said second distribution and a third distribution.

6. A nonvolatile memory system according to claim 5,
    wherein, in performing said read operation, said nonvolatile memory controls application of said read voltage to said word line from said first voltage level to said third voltage level one after another, and stops application of said read voltage in response to outputting of said first signal by said decision circuit.

* * * * *